(12) United States Patent  
Yamamoto et al.

(10) Patent No.: US 9,120,120 B2
(45) Date of Patent: Sep. 1, 2015

(54) CLEANING APPARATUS AND CLEANING METHOD, COATER/DEVELOPER AND COATING AND DEVELOPING METHOD, AND COMPUTER READABLE STORING MEDIUM

(71) Applicant: TOKYO ELECTRON LIMITED, Minato-ku (JP)

(72) Inventors: Taro Yamamoto, Koshi (JP); Naoto Yoshitaka, Koshi (JP); Shuichi Nishikido, Koshi (JP); Yoichi Tokunaga, Koshi (JP)

(73) Assignee: TOKYO ELECTRON LIMITED, Minato-ku (JP)

(*) Notice: Subject to any disclaimer, the term of this patent is extended or adjusted under 35 U.S.C. 154(b) by 4 days.

(21) Appl. No.: 14/460,020

(22) Filed: Aug. 14, 2014

(65) Prior Publication Data

US 2014/0352736 A1   Dec. 4, 2014

Related U.S. Application Data

(62) Division of application No. 12/366,198, filed on Feb. 5, 2009, now Pat. No. 8,851,092.

(30) Foreign Application Priority Data

Feb. 12, 2008   (JP) ................................. 2008-030857

(51) Int. Cl.
*B08B 3/00* (2006.01)
*B05D 3/10* (2006.01)
(Continued)

(52) U.S. Cl.
CPC ................ *B05D 3/105* (2013.01); *B05D 3/065* (2013.01); *B05D 5/06* (2013.01); *G03F 7/168* (2013.01); *H01L 21/67046* (2013.01); *H01L 21/67051* (2013.01)

(58) Field of Classification Search
CPC ................... H01L 21/67046; H01L 21/67051; H01L 21/02052; B05D 3/065; B05D 5/06; B05D 3/105; G03F 7/168
USPC ........ 134/56 R, 198, 26, 30, 61, 76; 430/322; 355/27, 77

See application file for complete search history.

(56) References Cited

U.S. PATENT DOCUMENTS 6,193,807 B1   2/2001   Tateyama et al.
6,261,378 B1   7/2001   Hashimoto et al.
(Continued)

FOREIGN PATENT DOCUMENTS

JP   7-249570   9/1995
JP   8-89910    4/1996
(Continued)

OTHER PUBLICATIONS

Japanese Office Action issued Mar. 6, 2012, in Japan Patent Application No. 2008-030857 (with partial English translation).

*Primary Examiner* — Michael Kornakov
*Assistant Examiner* — Katelyn Whatley
(74) *Attorney, Agent, or Firm* — Oblon, McClelland, Maier & Neustadt, L.L.P.

(57) ABSTRACT

A cleaning apparatus includes a first substrate-holding portion configured to hold a first area of a back surface of the substrate so that the top surface is kept face up; a second substrate-holding portion configured to hold a second area of the back surface of the substrate, the second area being not overlapped with the first area, and rotate the substrate; a top-surface cleaning nozzle configured to supply a top surface cleaning fluid to a top surface of the substrate; a bevel cleaning nozzle configured to supply a bevel cleaning fluid to a bevel portion of the substrate; a cleaning fluid supplying portion configured to supply a back surface cleaning fluid to the back surface of the substrate held by the first or the second substrate-holding portion; and a cleaning member configured to clean the back surface of the substrate held by the first or the second-substrate holding portion.

6 Claims, 16 Drawing Sheets

(51) Int. Cl.
*G03F 7/16* (2006.01)
*H01L 21/67* (2006.01)
*B05D 3/06* (2006.01)
*B05D 5/06* (2006.01)

(56) References Cited

U.S. PATENT DOCUMENTS

| | | |
|---|---|---|
| 6,295,683 B1 | 10/2001 | Lai et al. |
| 2001/0039118 A1 | 11/2001 | Marumo et al. |
| 2003/0108349 A1 | 6/2003 | Kanagawa |
| 2004/0197433 A1 | 10/2004 | Terada et al. |
| 2004/0226916 A1 | 11/2004 | Kobayashi et al. |
| 2006/0090848 A1 | 5/2006 | Koga et al. |
| 2007/0212884 A1* | 9/2007 | Yamamoto et al. ............ 438/694 |
| 2008/0124489 A1 | 5/2008 | Yamamoto et al. |

FOREIGN PATENT DOCUMENTS

| | | | |
|---|---|---|---|
| JP | 11162816 A * | 6/1999 | ............ H01L 21/027 |
| JP | 2006-80403 | 3/2006 | |
| JP | 2006-189687 | 7/2006 | |
| JP | 2006189687 A * | 7/2006 | |
| JP | 2006-319249 | 11/2006 | |
| JP | 2007-214279 | 8/2007 | |

* cited by examiner

CLEANING APPARATUS AND CLEANING METHOD, COATER/DEVELOPER AND COATING AND DEVELOPING METHOD, AND COMPUTER READABLE STORING MEDIUM

CROSS-REFERENCE TO RELATED APPLICATIONS

This application is a divisional of U.S. application Ser. No. 12/366,198, filed Feb. 5, 2009, now U.S. Pat. No. 8,851,092, and is based upon and claims the benefit of priority from prior Japanese Patent Application No. 2008-030857, filed Feb. 12, 2008, the entire contents of both of which are incorporated herein by reference.

BACKGROUND OF THE INVENTION

1. Field of the Invention

The present invention relates to a substrate cleaning technology for cleaning substrates such as a semiconductor wafer and a glass substrate (Liquid Crystal Display (LCD) substrate) prior to immersion exposure.

2. Description of the Related Art

In a fabrication process of a semiconductor device or an LCD, photolithography is indispensable in order to form a predetermined photoresist pattern on a substrate. The photolithography includes a series of processes of coating photoresist solution in order to form a resist film on the substrate such as a semiconductor wafer (referred to as a wafer below), exposing the resist film with exposure light through a photomask, and developing the resist film. Such processes are generally carried out in a resist pattern forming system having a coater/developer for forming the resist film and developing the resist film after the exposure and an exposure apparatus connected to the coater/developer.

With further reduction in a circuit pattern and a film thickness, increased resolution of the lithography is greatly demanded. In order to address such demand, so-called immersion exposure is under consideration. In immersion exposure process, a liquid layer is formed on the photoresist film and the exposure is carried out through the liquid layer on the photoresist film. Specifically, the liquid layer is formed between the wafer and a projection lens provided in an exposure apparatus, and the exposure light is illuminated onto the photoresist film through the projection lens and the liquid layer, thereby transferring a predetermined circuit pattern in the photomask onto the photoresist film. More specifically, the projection lens is positioned in a predetermined chip area in order to expose the chip area, and then laterally slid while the liquid layer is kept between the wafer and the projection lens, so that the projection lens is positioned in the adjacent chip area, thereby exposing the adjacent chip area. Such a procedure is repeated to expose all the chip areas in the wafer.

SUMMARY OF THE INVENTION

In such immersion exposure process, because the exposure is carried out by sliding the projection lens and thus the exposure apparatus with the liquid layer kept between the projection lens and the wafer, if there is a particle on the wafer, the particle may be included in the liquid layer. If this happens, the particle can also slide with the projection lens and the liquid layer, so that the particle may be transcribed to the photoresist film in all the chip areas. In other words, even if there is a particle on only a part of the wafer, the entire wafer may be affected by the particle. In order to address such a problem, the wafer has to be cleaned before the immersion exposure (see Patent Document 1, for example.)

In addition, because a peripheral portion of the wafer, which includes a bevel portion 10 (slanted portion) shown in FIG. 1, is outside of a chip forming area, the photoresist film and an anti-reflection film formed on the peripheral portion are unnecessary and removed with solvent in order to avoid particles generating from the peripheral portion, so that steps may be made in the portion, as shown in FIG. 1 that illustrates a wafer W, an anti-reflection film 11, a photoresist film 12, and a top coat 13. In such a structure, the top coat 13 may be easily peeled off from the bevel portion 10. Moreover, because the bevel portion 10 is met by a wafer transferring mechanism when the wafer W is transferred, the top coat 13 may be peeled off by the wafer transferring mechanism, which may cause particles to spread over a top surface of the wafer W. A cleaning method of cleaning the bevel portion 10 has been proposed in order to remove the particles in the bevel portion 10 prior to the immersion exposure. (See Patent Document 2, for example.)

Furthermore, particles on a back surface of the wafer have been paid attention to in recent years. When particles are on the back surface of the wafer, the particles are sandwiched between the wafer and a wafer stage on which the wafer is placed in the exposure apparatus, thereby causing warpage of the wafer. Such warpage may cause defocusing when the wafer is exposed to the exposure light, which can be a problem as the circuit dimensions are further reduced. Therefore, the back surface of the wafer also has to be cleaned prior to the immersion exposure.

Cleaning the wafer including the bevel portion and the back surface generally needs to be carried out in a cleaning apparatus provided outside of the photoresist pattern forming system before the wafer W is transferred into the exposure apparatus, because a highly clean environment is kept in the photoresist pattern forming system. However, transferring the wafer from the photoresist pattern forming system to the cleaning apparatus and otherwise may be disadvantageous from viewpoint of particles. In addition, it has been found that even particles of only 5 to 10 μm may cause warpage of the wafer W, resulting in the defocus problem in aforementioned the immersion exposure. Therefore, pre-cleaning the wafer W is preferably carried out in a cleaning unit coupled to the photoresist pattern forming system in a highly clean environment and before the immersion exposure process.

The wafer is cleaned generally in the following manner. First, the wafer is firmly fixed by, for example, a vacuum chuck or a mechanical chuck. Second, deionized water (referred to as DIW below) is supplied onto the wafer. Then, a brush is pressed onto the wafer with the DIW continuously supplied onto the wafer, and the brush and the wafer are relatively slid, thereby removing the particles. Because the wafer is transferred in a face-up manner in the photoresist pattern forming system, the wafer has to be reversed when cleaning the back surface of the wafer. Therefore, when the cleaning unit that is capable of cleaning the back surface of the wafer is incorporated in the photoresist pattern forming system, a so-called reverser for inverting the wafer has to be provided between the cleaning unit and the wafer transferring mechanism. However, such a reverser requires additional space for the reverser itself and for reversing the wafer. As a result, the photoresist pattern forming system tends to be larger. On the other hand, the brush may be provided below the wafer so that the back surface of the wafer is cleaned from below in order to eliminate the need of the reverser. However, because the back surface of the wafer is covered at least in part by the wafer transferring mechanism, the entire back surface of the wafer cannot be cleaned in such a configuration.

In addition, even though the photoresist pattern forming system already includes plural units including coating units, developing units, pre-treatment/post-treatment units, and the like, there is a demand for increasing the number of units in order to increase throughput, while realizing a reduced foot print of the system. It is contrary to such a demand to separately incorporate a top surface cleaning unit, a back surface cleaning unit, and a bevel cleaning unit. Moreover, it takes more time to separately clean the top surface, the back surface, and the bevel portion of the wafer and to transfer the wafer to each cleaning unit, which is disadvantageous from a viewpoint of throughput.

Furthermore, a hydrophobizing process for improving adhesiveness of an anti-reflection film solution and the photoresist solution is carried out in order to avoid peeling of the anti-reflection film and the photoresist film during the immersion exposure. Because the hydrophobizing process is carried out using vapor of a hydrophobizing agent, the vapor flows around the wafer edge to reach a part of the back surface of the wafer. Specifically, a back surface area of about 15 mm width from the wafer edge is hydrophobized, as shown in the bottom left of FIG. 2, in which a hatched line portion 14 represents the hydrophobized area.

In other words, there are the hydrophobized area and an unhydrophobized area on the back surface of the wafer. While the brush cleaning is effective for the unhydrophobized area, the brush is worn away on the hydrophobized area because the area is not easily wet with DIW, which may generate many particles contaminating the wafer.

Therefore, at least the following should be considered. First, the top surface, the bevel portion, and the back surface of the wafer should be cleaned before the exposure process, for example, in the case of immersion exposure. In addition, such cleaning needs to be carried out in one module. Moreover, appropriate cleaning techniques should be chosen for a hydrophobic area and an unhydrophobic area of the wafer.

For example, the patent document 1 below describes a cleaning technique for cleaning the top surface of the wafer before immersion exposure, and the patent document 2 describes a technique for removing the photoresist film in the bevel portion of the wafer. However, these documents 1, 2 do not disclose a cleaning technique for cleaning the back surface of the wafer, or a cleaning technique for cleaning the top surface, the bevel portion, and the back surface of the wafer W while maintaining both a smaller footprint of the cleaning apparatus and a higher production throughput.

Patent document 1: Japanese Patent Application Laid-Open Publication No. 2006-80403.

Patent document 2: Japanese Patent Application Laid-Open Publication No. 2007-214279.

The present invention has been made in view of the above, and is directed to a substrate cleaning technology for cleaning a top surface, a bevel portion, and a back surface of a substrate such as a semiconductor wafer and a glass substrate for an LCD prior to immersion exposure in a single cleaning apparatus.

A first aspect of the present invention provides a cleaning apparatus that cleans a substrate on which a photoresist film is formed, the photoresist film being to be exposed to exposure light with a liquid layer being formed on a top surface of the photoresist film. The cleaning apparatus includes a first substrate holding portion configured to hold the substrate at a first area in a back surface of the substrate so that the top surface is kept face up; a second substrate holding portion configured to hold the substrate at a second area in the back surface of the substrate, the second area being not overlapped with the first area, and rotate the substrate around a substantial center of the substrate; a top surface cleaning nozzle configured to supply a top surface cleaning fluid to a top surface of the substrate that may be rotated by the second substrate holding portion; a bevel cleaning nozzle configured to supply a bevel cleaning fluid to a bevel portion of the substrate that may be rotated by the second substrate holding portion; a cleaning fluid supplying portion configured to supply a back surface cleaning fluid to a back surface of the substrate held by the first substrate holding portion or the second substrate holding portion; and a cleaning member configured to clean the back surface of the substrate held by the first substrate holding portion or the second substrate holding portion.

A second aspect of the present invention provides a cleaning apparatus according to the first aspect, further including a moving mechanism configured to laterally move the first substrate holding portion in relation to the second substrate holding portion; and an elevation mechanism configured to vertically move the first substrate holding portion in relation to the second substrate holding portion.

A third aspect of the present invention provides a cleaning apparatus according to the first or the second aspect, further including a controller configured to output an instruction in accordance with which one part of the back surface of the substrate, the one part including the second area, is cleaned by the cleaning member while the substrate is held by the first substrate holding portion, the substrate is transferred from the first substrate holding portion to the second substrate holding portion, and another part of the back surface of the substrate, the another part not including the second area, is cleaned by the cleaning member while the substrate is rotated by the second substrate holding portion.

A fourth aspect of the present invention provides a cleaning apparatus according to the third aspect, wherein the controller is further configured to output another instruction in accordance with which, in a time period during which the one part of the back surface, the one part not including the second area, is cleaned by the cleaning member, the top surface cleaning fluid is supplied to the top surface of the substrate from the top surface cleaning nozzle, and the bevel cleaning fluid is supplied to the bevel portion of the substrate from the bevel cleaning nozzle.

A fifth aspect of the present invention provides a cleaning apparatus according to any one of the first through the fourth aspects, further including a back periphery cleaning nozzle configured to supply a back periphery cleaning fluid to a back peripheral area in the substrate held and rotated around the substantial center of the substrate by the second substrate holding portion.

A sixth aspect of the present invention provides a cleaning apparatus according to the fifth aspect, wherein the controller is configured to output yet another instruction in accordance with which, in a time period during which one part of the back surface, the one part not including the second area, is cleaned by the cleaning member, the top surface cleaning fluid is supplied to the top surface of the substrate from the top surface cleaning nozzle, the bevel cleaning fluid is supplied to the bevel portion of the substrate from the bevel cleaning nozzle, and the back periphery cleaning fluid is supplied to the back surface of the substrate from the back periphery cleaning nozzle.

A seventh aspect of the present invention provides a coater and developer including a coating unit configured to coat a photoresist film on a top surface of a substrate; a developing unit configured to supply a developing solution to the photoresist film coated on the top surface of the substrate, the photoresist film being exposed to exposure light with a liquid layer being formed on the photoresist film, thereby developing the photoresist film; and a cleaning apparatus according to any one of the first through the sixth aspects.

An eighth aspect of the present invention provides a cleaning method that cleans a substrate on which a photoresist film is formed, the photoresist film being to be exposed to exposure light with a liquid layer being formed on a top surface of the photoresist film. The cleaning method includes a second area cleaning step, wherein a first area in a back surface of the substrate is held with a first substrate holding portion, the back surface being kept face down, and a second area in the back surface of the substrate, the second area being not overlapped with the first area, is cleaned prior to immersion lithography; a substrate holding step, wherein the substrate is transferred from the first substrate holding portion to a second substrate holding portion, and the second area in the back surface of the substrate is held by the second substrate holding portion; a top surface cleaning step, wherein a top surface cleaning fluid is supplied to a top surface of the substrate that is held and rotated around a vertical axis by the second substrate holding portion, thereby cleaning the top surface; a bevel cleaning step, wherein a bevel cleaning fluid is supplied to a bevel portion of the substrate that is held and rotated around a vertical axis by the second substrate holding portion, thereby cleaning the bevel portion; and a back surface cleaning step, wherein one part of the back surface of the substrate, the one part not including the second area, is cleaned, the substrate being held and rotated around the substantial center of the substrate by the second substrate holding portion, thereby cleaning the one part.

A ninth aspect of the present invention provides a cleaning method according to the eighth aspect, wherein the top surface cleaning step, the bevel cleaning step, and the back surface cleaning step are overlapped time-wise.

A tenth aspect of the present invention provides a cleaning method according to the eighth or the ninth aspect, further including a back periphery cleaning step, wherein a periphery cleaning fluid is supplied to a periphery area in the back surface of the substrate that is held and rotated around the substantial center of the substrate by the second substrate holding portion, thereby cleaning the periphery area.

An eleventh aspect of the present invention provides a cleaning method according to the tenth aspect, wherein the top surface cleaning step, the bevel cleaning step, the back surface cleaning step, and the back periphery cleaning step are overlapped time wise.

A twelfth aspect of the present invention provides a coating and developing method including steps of forming a photoresist film on a substrate; cleaning the substrate on which the photoresist film is formed in accordance with the cleaning method according to any one of the eighth through the eleventh aspects; and exposing the photoresist film to exposure light through a liquid layer formed on the photoresist film.

A thirteenth aspect of the present invention provides a computer readable storage medium storing a computer program to be used in a cleaning apparatus that cleans a substrate on which a photoresist film is formed, the photoresist film being to be exposed to exposure light with a liquid layer being formed on a top surface of the photoresist film, the computer program, when executed by a computer, comprising steps that cause the cleaning apparatus to carry out a cleaning method according to the eighth through the eleventh aspect.

DETAILED DESCRIPTION OF THE PREFERRED EMBODIMENT

In a cleaning apparatus according to embodiments of the present invention, because the substrate is held from a back surface of the substrate so as to be face up when the back surface of the substrate is cleaned, there is no need for a reverser that reverses the substrate for the purpose of cleaning the back surface of the substrate. Therefore, the space required to implement the reverser and the space required to reverse the substrate are not required, thereby making the cleaning apparatus compact.

In addition, because the substrate is once held by a first substrate holding portion and then held by a second substrate holding portion, the back surface of the substrate may be cleaned.

Moreover, because the substrate is held face up when the back surface of the substrate is cleaned, the top surface, the bevel portion, and the back surface of the substrate are cleaned in one cleaning apparatus. Therefore, a substrate transferring time can be reduced, thereby increasing the production throughput, when compared to use of corresponding cleaning apparatuses for cleaning the top surface, the bevel portion, and the back surface of the substrate.

Furthermore, the cleaning apparatus need only occupy a space sufficient for one cleaning apparatus in a coater/developer when incorporated in the coater/developer. Therefore, a footprint of the coater/developer is not increased and substrate cleaning can be carried out within the coater/developer before immersion exposure.

<First Embodiment>

Figure 1:
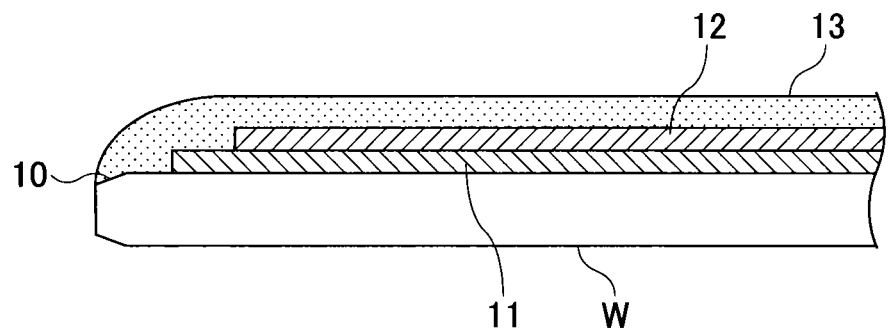
FIG. 1 is a cross-sectional view of a bevel portion of a wafer on which an anti-reflection film, a photoresist film, and a top coat are formed.
Figure 2:
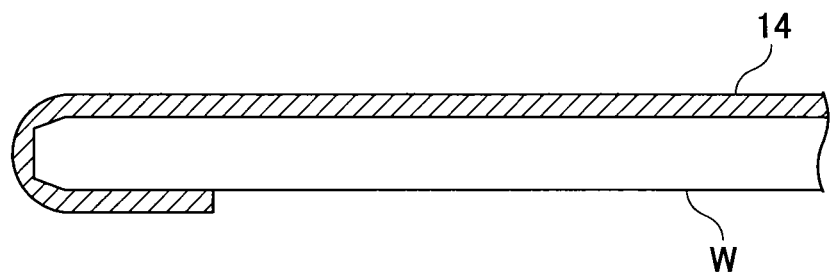
FIG. 2 is a cross-sectional view of a wafer, illustrating that a peripheral area in the back surface of the wafer may become hydrophobic.
Figure 3:
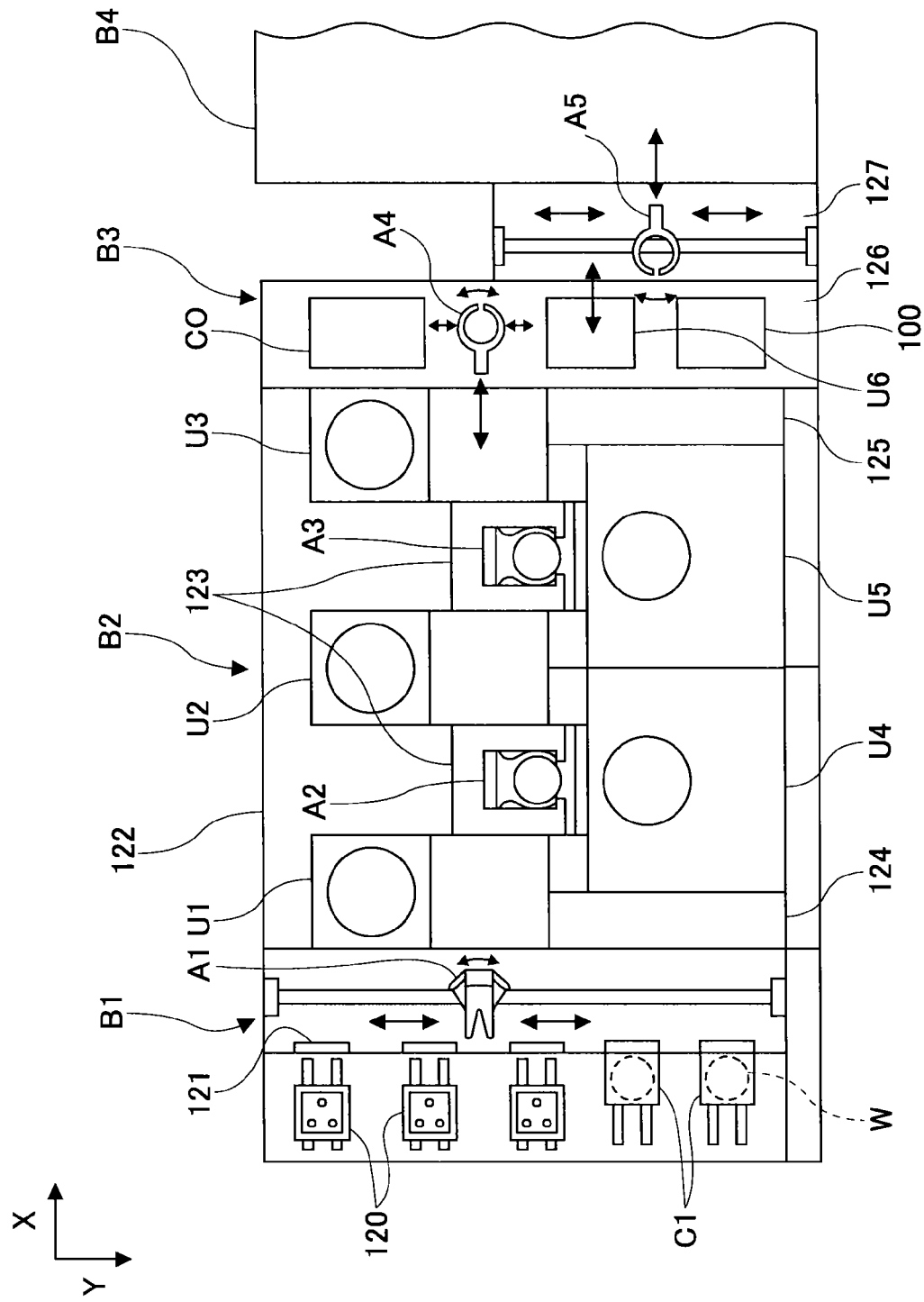
FIG. 3 is a plan view of an example of photoresist pattern forming system including a photoresist coater/developer into which a cleaning apparatus according to a first embodiment of the present invention is incorporated.
Figure 4:
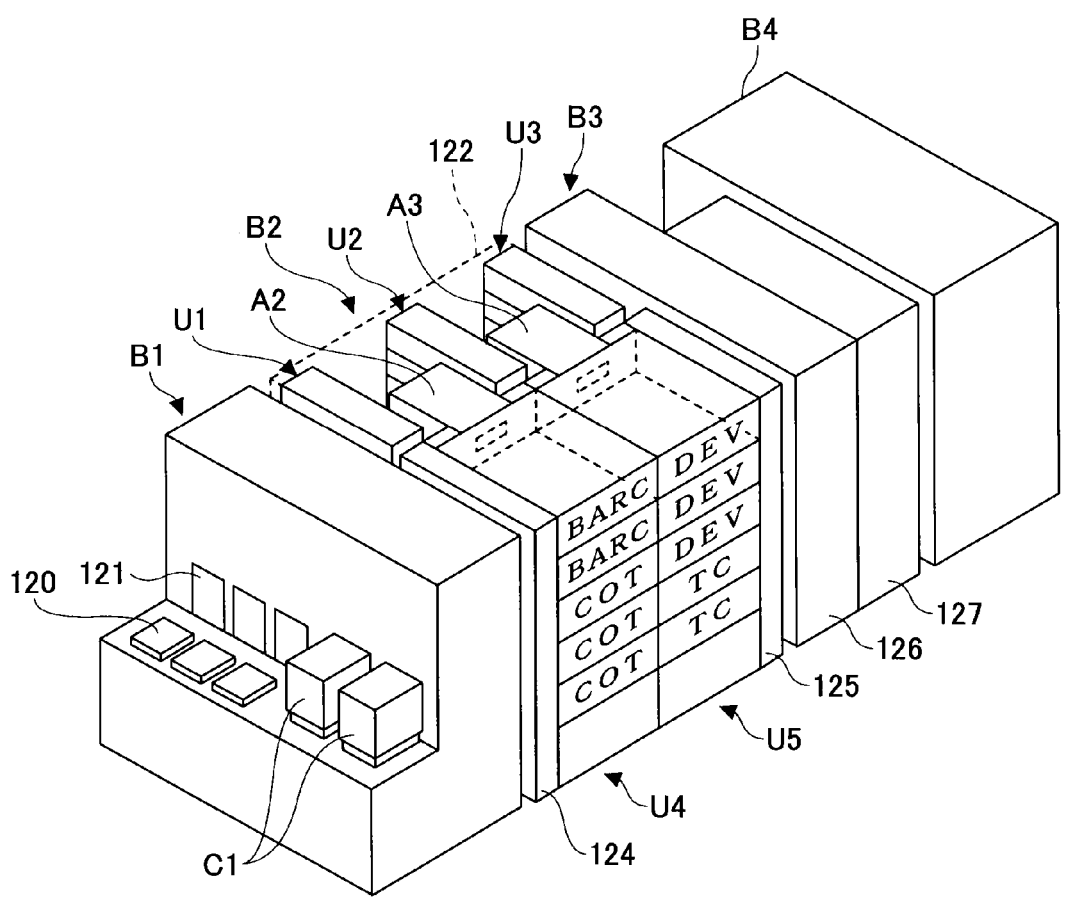
FIG. 4 is a perspective view of the photoresist coater/developer shown in FIG. 3.

Referring to FIGS. 3 and 4, a photoresist pattern forming system is described that integrates a coater/developer according to a first embodiment of the present invention. This system includes the coater/developer and an immersion exposure apparatus coupled to the coater/developer. In FIG. 3, a carrier station B1 has carrier stages 120 where carriers C1 are placed. The carriers C1 can house, for example, thirteen semiconductor wafers (referred to as a wafer below) as substrates in an airtight manner. In addition, the carrier station B1 has opening/closing portions 121 provided on the outlet side of the carriers C1 placed on the carrier stages 120, and a transfer mechanism A1 that transfers the wafers from/into the carrier C1 through the opening/closing portions 121.

When seen in an X direction in FIG. 3 from the carrier station B1, there is a process station B2 that is enclosed by a chassis 122 and coupled to the carrier station B1. The process station B2 includes shelf units U1, U2, and U3 having heating and cooling units stacked one on another, liquid process units U4 and U5 (described below), and main transfer mechanisms A2 and A3. The shelf units U1 through U3 are arranged in this order in a direction from the carrier station B1 to the process station B2. The liquid process units U4 and U5 are arranged in this order in the same direction, opposing the shelf units U1 through U3. The main transfer mechanisms A2 and A3 transfer the wafer into/from each unit of the shelf units U1 through U3 and the liquid process units U4 and U5. Specifically, when seen from a Y direction in FIG. 3, the main transfer mechanism A2 is arranged between the shelf units U1 and U2, and the main transfer mechanism A3 is arranged between the shelf units U2 and U3. More specifically, the transfer mechanism A2 is positioned in a space substantially defined by the shelf units U1, U2, the liquid process unit U4, and a partition wall 123. Similarly, transfer mechanism A3 is positioned in a space substantially defined by the shelf units U2, U3, the liquid process unit U5, and a partition wall 123. Additionally, temperature/humidity control units that include a temperature controller for process agents used in the liquid process units U4, U5 and ducts or the like for controlling temperature/humidity inside the chassis 122 are provided in spaces indicated by "124" and "125" in FIG. 3.

The liquid process units U4 and U5 include coating units COT, developer units DEV, anti-reflection coating units BARC and top coating units TC, which are stacked into plural (e.g., five) stages, as shown in FIG. 4. The shelf units U1 through U3 include various units stacked in plural (e.g., ten) stages, in which pre- and post-treatments are carried out before and after processes carried out in the liquid process units U4 and U5. Specifically, the various units may be hydrophobizing process units for hydrophobizing the wafer W, heating units for heating (baking) the wafer W, cooling units for cooling the wafer W, and the like.

The immersion exposure apparatus B4 where immersion exposure is carried out is coupled to the process station B2 behind the shelf unit U3 via an interface station B3. The interface station B3 includes a first transfer chamber 126 and a second transfer chamber 127, which are arranged in this order in a direction from the process station B2 to the exposure apparatus B4. The first transfer chamber 126 is provided with a first transfer arm A4, and the second transfer chamber 127 is provided with a second transfer arm A5. The first and the second transfer arms A4, A5 are elevatable, rotatable around a vertical axis, and slidable. In addition, the first transfer chamber 126 is provided with a shelf unit U6, a buffer cassette CO, and a cleaning apparatus 100 (described below). The shelf unit U6 includes a high accuracy temperature control unit having a heating unit and a cooling plate that are used to carry out post exposure bake, and a transfer unit that is used to transfer the wafer W between the first transfer arm A4 and the second transfer arm A5. The high accuracy temperature control unit and the transfer unit are stacked one above another. The second transfer arm A5 transfers the wafer W to/from the cleaning apparatus 100.

The wafer W is transferred throughout the photoresist pattern forming system in the following manner. First, when the carrier C1 that houses the wafers W is placed on the carrier stage 120, the opening/closing portion 121 is opened along with a lid of the carrier C1. Second, one of the wafers W is taken out from the carrier C1 by the transfer mechanism A1. Next, the wafer W is transferred to the main transfer mechanism A2 through a transfer unit, which corresponds to one stage of the shelf unit U1, and then to the hydrophobizing unit, in which the wafer W undergoes the hydrophobizing process. Subsequently, the wafer W is transferred to the anti-reflection coating unit BARC, in which an anti-reflection film is formed on the wafer W. Then, the wafer W is baked in the heating unit.

Next, the wafer W is transferred to the coating unit COT, in which a photoresist film is formed on the top surface of the wafer W. Then, the wafer W undergoes heat treatment in the heating unit, and further transferred to the interface station B3 by the main transfer mechanism A3 via a transfer unit of the shelf unit U3. The wafer W is transferred from the first transfer arm A4 to the second transfer arm A5 via the transfer unit of the shelf unit U6, and then to the cleaning apparatus 100 by the second transfer arm A5 in the interface station B3. In the cleaning apparatus 100, the top surface, the bevel portion, and the back surface of the wafer W, which has not undergone the immersion exposure, are cleaned. When a protect film for the immersion exposure is coated on the photoresist film, the protect film agent is coated in a unit (not shown) in the process station B2 after the wafer W is cooled in the cooling unit.

The wafer W cleaned in the cleaning apparatus 100 is transferred to the exposure apparatus B4 and undergoes the immersion exposure with, for example, pure water layer formed on the top surface of the wafer W. Then, the wafer W, which has undergone the immersion exposure, is taken out from the exposure apparatus B4 and transferred to, for example, the cleaning apparatus 100 of the interface station B3, where remaining pure water on the top surface of the wafer W is eliminated. Next, the wafer W is transferred to the heating unit, which corresponds to one stage of the shelf unit U6, and undergoes a post exposure baking (PEB) process.

Subsequently, the wafer W is taken out from the heating unit by the first transfer arm A4, transferred to the main transfer mechanism A3, and then transferred to the developer unit DEV by the main transfer mechanism A3. After the wafer W undergoes a predetermined developing process in the developer unit DEV, the wafer W is baked in the heating unit and then returned back to the carrier station B1 and thus the carrier C1, to which the wafer W originally belongs, by the transfer mechanism A1.

Figure 5:
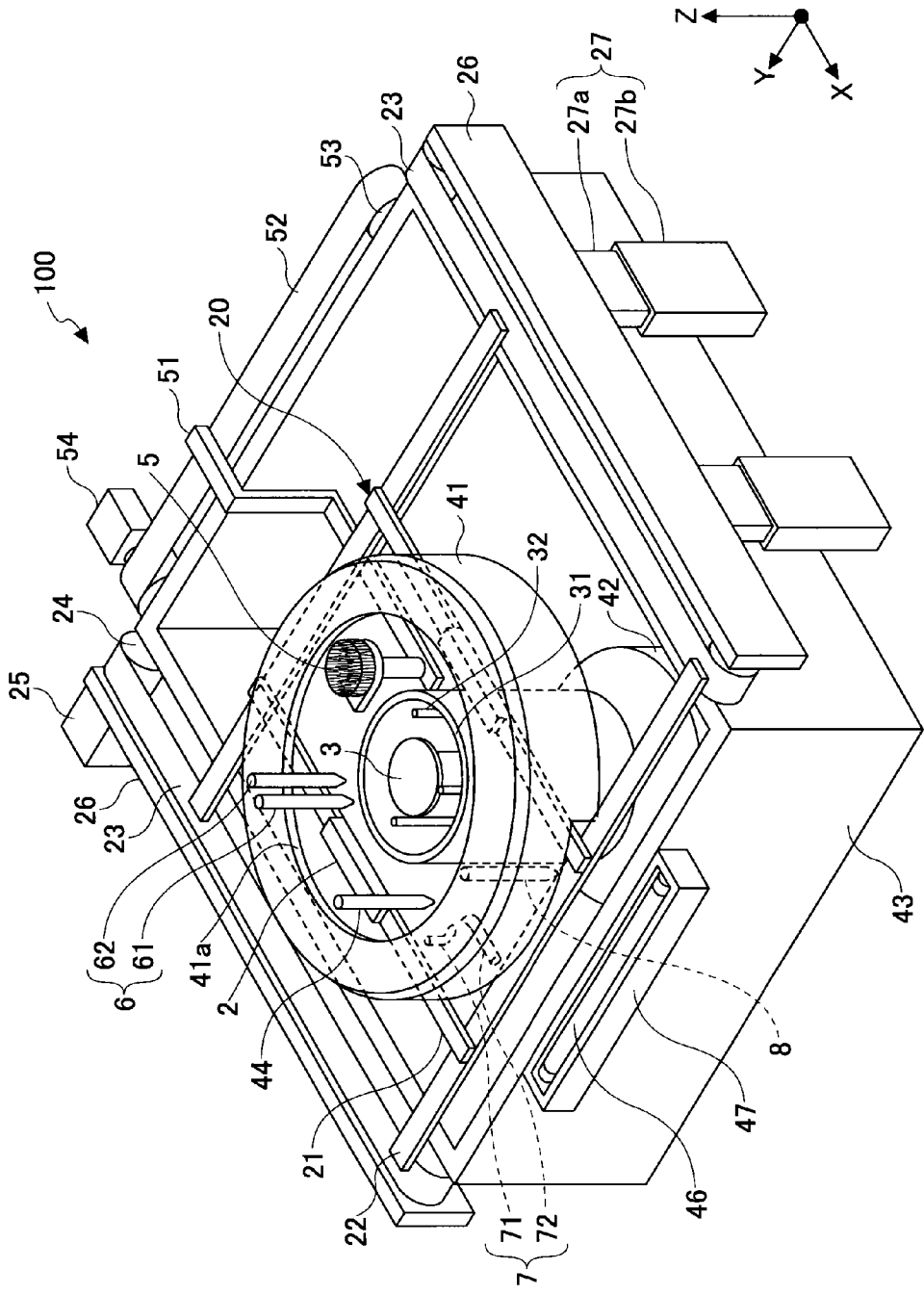
FIG. 5 is a perspective view of the cleaning apparatus according to the first embodiment of the present invention.
Figure 6:
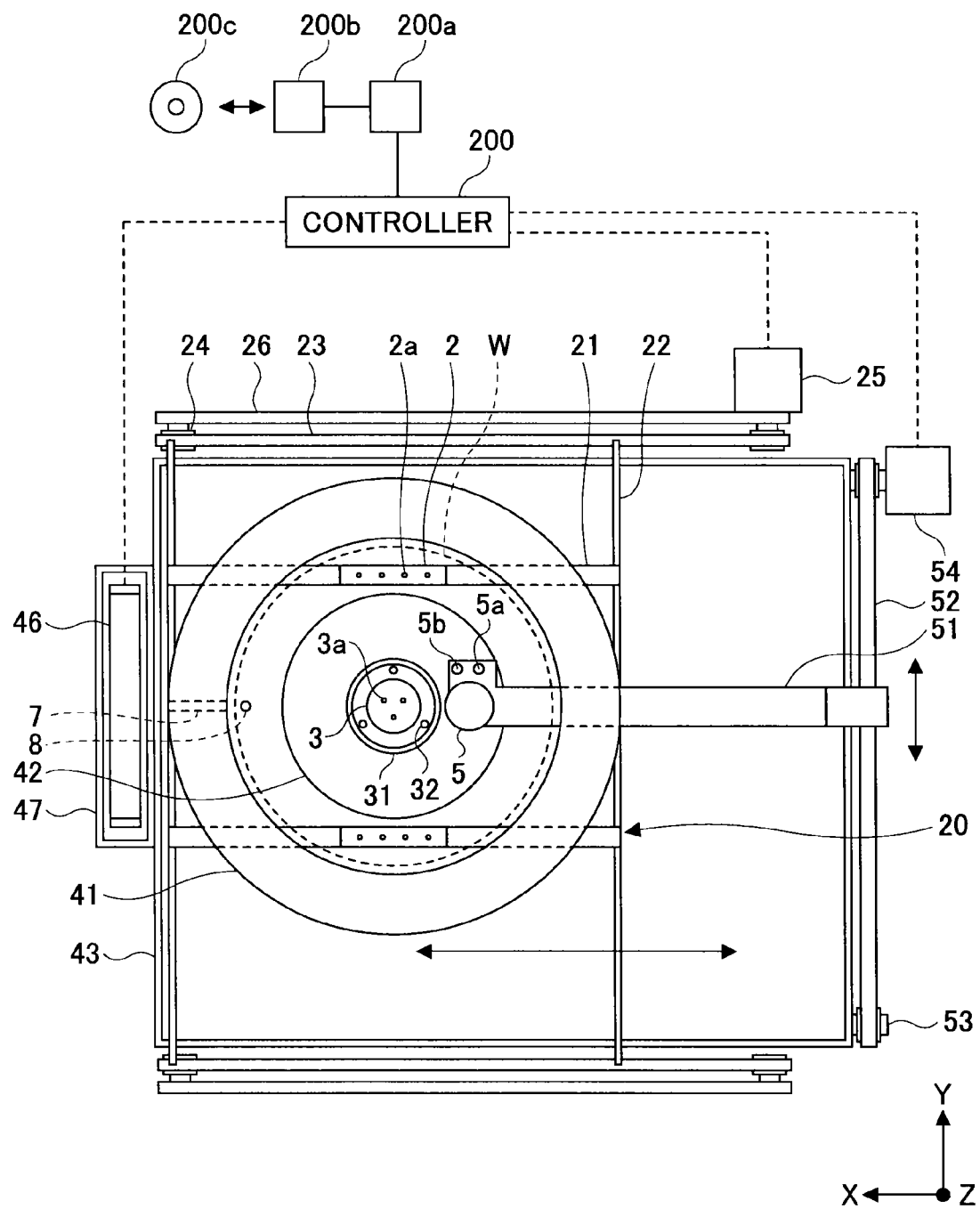
FIG. 6 is a plan view of the cleaning apparatus shown in FIG. 5.
Figure 7:
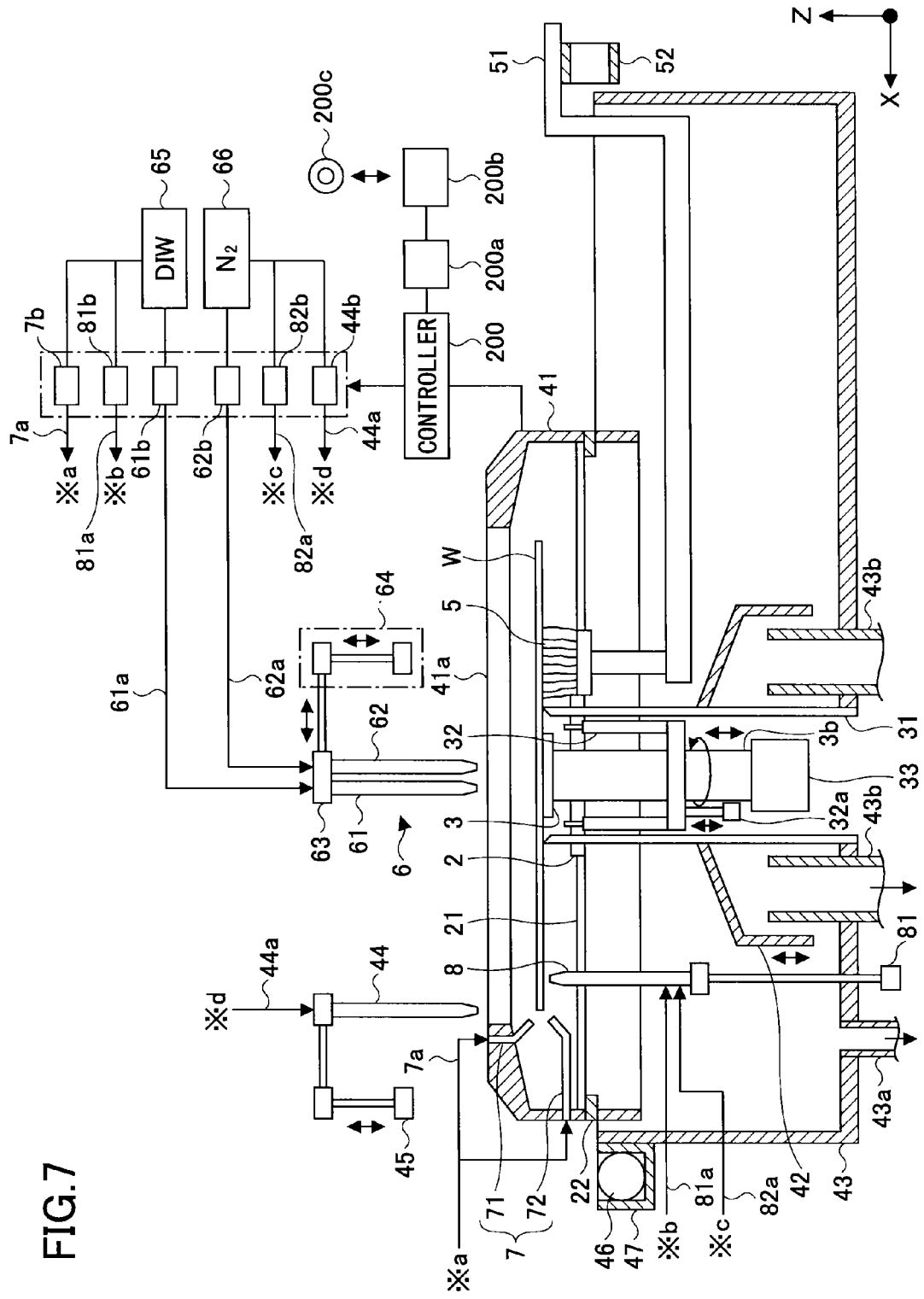
FIG. 7 is a cross-sectional view of the cleaning apparatus shown in FIG. 5.

Next, the cleaning apparatus 100 incorporated into the above photoresist pattern forming system is described in detail in reference to FIGS. 5 through 7, which are a perspective view, a plan view, and a cross-sectional view of the cleaning apparatus 100, respectively. As shown in FIG. 5, the cleaning apparatus 100 includes a box-shaped under cup 43 having a top opening; two suction pads 2 as a first substrate holding portion that receives the wafer W from the second transfer arm A5 of the coater/developer, which is a transfer arm outside of the cleaning apparatus 100, and holds the wafer W by suction; a spin chuck 3 as a second substrate holding portion that receives the wafer W from the suction pads 2 and substantially horizontally holds the wafer W by suction; a brush 5 that cleans a first cleaning area in the back surface of the wafer W, the first cleaning area being substantially in the center portion of the back surface of the wafer W; a top surface cleaning nozzle 6 that cleans the top surface of the wafer W; a bevel cleaning nozzle 7 that cleans the bevel portion of the wafer W; and a back periphery cleaning nozzle 8 that cleans a second cleaning area in the back surface of the wafer W, the second cleaning area being substantially outside of the first cleaning area.

First, the suction pads 2 as the first substrate holding portion are described. As shown in FIG. 5, the cleaning apparatus 100 includes the two suction pads 2, each of which is configured of, for example, an elongated block. The two suction pads 2 are arranged in parallel with each other, leaving a predetermined distance, in order to hold a peripheral area (a first area) in the back surface of the wafer W. The two suction pads 2 are connected to corresponding suction tubes (not shown), and serve as vacuum chucks that hold the wafer W by suction through suction holes 2a shown in FIG. 6. As shown in FIG. 5, the suction pads 2 are attached on a substantially center portion of corresponding pad supporting portions 21 having an elongated rod shape. The pad supporting portions 21 are attached on corresponding bridging beam portions 22. The pad supporting portions 21 and the bridging beam portions 22 constitute a double cross portion 20.

Both ends of the two bridging beam portions 22 are attached on corresponding belts 23 wound around corresponding pairs of pulleys 24. The two pairs of the pulleys 24 are rotatably provided on corresponding side plates 26 that oppose corresponding side walls of the under cup 43. A driving mechanism 25 is coupled to one of the pair of the pulleys 24. With such a configuration, when the pulleys 24 are rotated by the driving mechanism 25, the belts 23 can be moved around the pulleys 24 along the corresponding side walls. As a result, the bridging beam portions 22 and thus the double cross portion 20 can move in an X direction shown in FIGS. 5 and 6.

Each of the side plates 26 is supported at its bottom surface by a pair of elevation mechanisms 27 composed of sliders 27a and guide rails 27b, as shown in FIG. 5. The elevation mechanisms 27 are attached on a chassis bottom surface (not shown) of the cleaning apparatus 100. A driving mechanism (not shown) is coupled to one of the elevation mechanisms 27 in order to move upward/downward the slider 27a along the guide rail 27b, which can move the double cross portion 20 in a Z direction shown in FIG. 5.

An upper cup 41 having substantially a ring shape is provided above the double cross portion 20 in order that mist or droplets of cleaning fluid are not scattered around. The upper cup 41 has an opening 41a larger than the diameter of the wafer W, through which the wafer W is transferred between the second transfer arm A5 and the suction pads 2. The wafer W can be held in a first cleaning position by the suction pads 2. The upper cup 41 provided above the double cross portion 20 can move in the X and the Z directions along with the double cross portion 20, as shown in FIG. 5.

Next, the spin chuck 3 as the second substrate holding portion is described. The spin chuck 3 has a disk shape and holds a back surface center portion of the wafer W (a second area). The spin chuck 3 is arranged between the two suction pads 2 disposed in parallel with each other. Therefore, the second area held by the spin chuck 3 is not overlapped with the first area held by the suction pads 2. As shown in FIG. 7, the spin chuck 3 is coupled to a driving mechanism (spin chuck motor) 33 via a shaft 3b, so that the spin chuck 3 is rotatable around a vertical axis and elevatable by the driving mechanism 33. The elevation mechanism 27 that moves the double cross portion 20 upward/downward and the driving mechanism 33 that moves and drives the spin chuck 3 constitute an elevation portion that moves the spin chuck 3 (the second substrate holding portion) and the suction pads 2 (the first substrate holding portion) upward/downward.

The spin chuck 3 is connected to a suction tube (not shown) in the same manner as the suction pads 2 that is connected to the suction tube (not shown). With this, the spin chuck 3 serves as a vacuum chuck that holds the wafer W by suction through suction holes 3a (FIG. 6). Moreover, supporting pins 32 are arranged in order to surround the spin chuck 3. The supporting pins 32 are connected to an elevation mechanism 32a (FIG. 7), so that the supporting pins 32 can support the back surface of the wafer W and move the wafer W upward/downward. With the supporting pins 32 and a transfer mechanism (the second transfer arm A5) outside of the cleaning apparatus 100 working in cooperation with each other, the wafer W can be transferred from the transfer mechanism to the suction pads 2, and from the suction pads to the spin chuck 3, and the opposite way.

Figure 8:
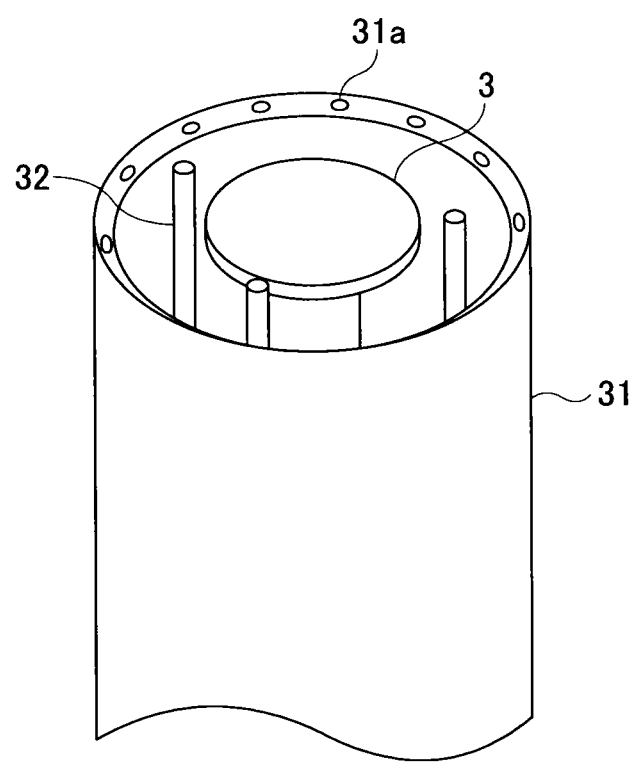
FIG. 8 is a perspective view of an air-knife provided in the cleaning apparatus shown in FIG. 5.

Referring to FIGS. 5 through 7, an air knife 31 having a cylindrical shape is located so as to enclose the spin chuck 3 and the supporting pins 32. As shown in FIG. 8, the air knife 31 has plural ejection orifices 31a at its top end. The ejection orifices 31a are arranged along a circumferential direction. The air knife 31 ejects gas, for example, pressurized air or the like supplied from a gas supplier (not shown) toward the back surface of the wafer W from the ejection orifices 31a so as to blow off the cleaning fluid on the back surface. Namely, the air knife 31 serves as a dryer to keep dry the top surface of the spin chuck 3 and the back surface to be contacted by the spin chuck 3 (the second area). The air knife 31 is preferably composed of a dual cylinder having a hollow space between the two cylindrical walls, as shown in FIG. 8. With this configuration, the air knife 31 can eject the gas from the ejection orifices 31a through the hollow space.

Next, the brush 5, which serves as a cleaning member that contacts and cleans the back surface of the wafer W, is described. The brush 5 is composed by bundling, for example, plural plastic strings into a cylindrical column. The plastic strings may be made of, for example, polyvinyl chloride (PVC), urethane, nylon, or the like. The brush 5 is rotatably attached at the distal end of a supporting portion 51. The supporting portion 51 has a ladle-like shape so as not to obstruct the movement of the wafer W and the bridging beam portions 22. The base end of the supporting portion 51 is fixed on a belt 52 wound around a pair of spindles (or pulleys) 53 (FIG. 5) that are rotatably attached on one of side walls extending along the Y direction. One of the spindles 53 is connected to a driving mechanism 54 (FIGS. 5 and 6), which rotates the spindle 53 and moves the belt 52 in clockwise and counter clockwise directions. In such a manner, the supporting portion 51 and thus the brush 5 can move reciprocally along the Y direction shown in FIGS. 5 and 6.

A rotating mechanism (not shown) is provided at the distal end of the supporting portion 51 in order to rotate the brush 5.

The brush 5 can contact or be pressed onto the back surface of the wafer W and rotate in order to remove particles on the back surface. Moreover, a cleaning fluid nozzle 5a and a blowing nozzle 5b are provided at the distal end of the supporting portion 51, as shown in FIG. 6. The cleaning fluid nozzle 5a supplies the cleaning fluid, for example, DIW or purified water in order to wash away the particles removed by the brush 5. The blowing nozzle 5b ejects gas, for example, nitrogen ($N_2$) so as to facilitate drying the back surface of the wafer W after the back surface is cleaned.

Figure 9:
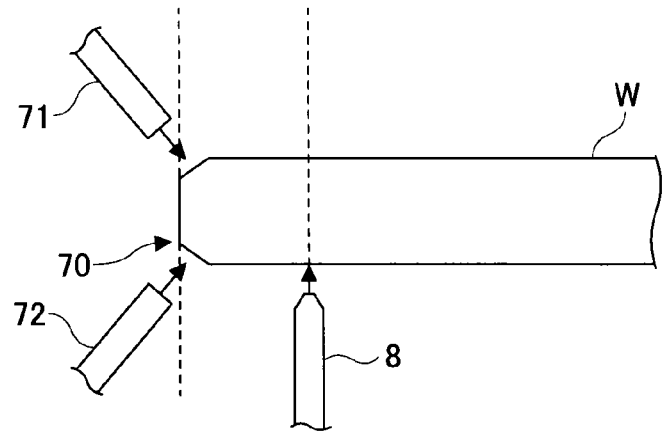
FIG. 9 illustrates a positional relationship between a bevel portion of a wafer and bevel cleaning nozzles.

In addition, the upper cup 41 is provided with a bevel cleaning nozzle 7 for cleaning a bevel portion 70 (FIG. 9) of the wafer periphery. The bevel cleaning nozzle 7 is configured to eject cleaning fluid such as DIW for cleaning the bevel portion 70 to wash away particles that are on the bevel portion 70, when the wafer W is in the second cleaning position. The bevel cleaning nozzle 7 includes an upper nozzle 71 for ejecting the cleaning fluid to the bevel portion 70 in an orthogonal direction from outside and above the wafer W, and a lower nozzle 72 for ejecting the cleaning fluid to the bevel portion 70 in an orthogonal direction from outside and below the wafer W, as shown in FIG. 9. The tip portions of the upper nozzle 71 and the lower nozzle 72 are positioned outside of a vertical transfer path of the wafer W so as not to obstruct the upward/downward movement of the wafer W in the upper cup 41, as shown in FIG. 7.

The cleaning apparatus 100 also includes a top surface cleaning nozzle 6 for cleaning the top surface of the wafer W in the second cleaning position, as shown in FIG. 7. The top surface cleaning nozzle 6 includes a cleaning fluid nozzle 61 configured to eject cleaning fluid, for example, DIW to the top surface of the wafer W in order to wash away particles that are on the top surface of the wafer W, and a gas nozzle 62 configured to supply gas, for example, nitrogen ($N_2$) to the top surface of the wafer W in order to dry the cleaning fluid from the top surface of the wafer W. The cleaning fluid nozzle 61 and the gas nozzle 62 are supported by a shared supporting portion 63, and movable in a direction along the diameter of the wafer W and elevatable upward/downward by a driving mechanism 64. When the wafer W is transferred to the cleaning apparatus 100, the cleaning fluid nozzle 61 and the gas nozzle 62 are positioned above the wafer W being transferred so as not to obstruct the wafer W and the transfer mechanism.

The cleaning apparatus 100 further includes a back periphery cleaning nozzle 8 for cleaning the second cleaning area S2 in the back surface of the wafer W.

Figure 10:
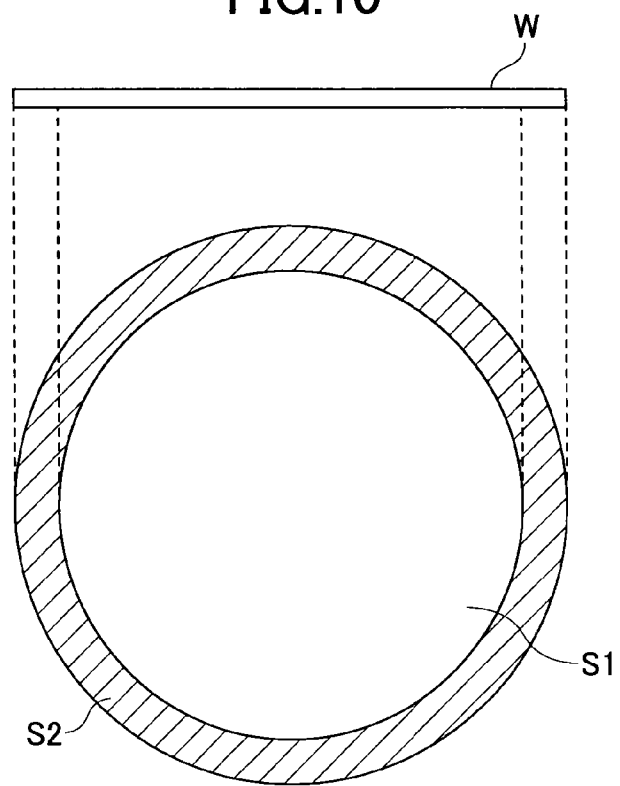
FIG. 10 is an explanatory plan view of a first cleaning area and a second cleaning area of a wafer.

Next, the first cleaning area S1 and the second cleaning area S2 are described in reference to FIG. 10. The second cleaning area S2 occupies a ring-shaped area having a width of about 15 mm from the peripheral edge of the wafer W on the back surface of the wafer W. The first cleaning area S1 is inside the second cleaning area S2. The second cleaning area S2 includes an area affected by the hydrophobizing agent, so that the area presents hydrophobic property. The hydrophobizing agent is used and flows around the wafer edge to the back surface of the wafer W in the hydrophobizing process, which is carried out before the photoresist film is formed. The second cleaning area S2 is determined to be larger than such a hydrophobic area by specifically estimating the hydrophobic area in advance.

The back periphery cleaning nozzle 8 is arranged so that cleaning fluid for cleaning the back surface of the wafer W is ejected from the back periphery cleaning nozzle 8 to the boundary between the first cleaning area S1 and the second cleaning area S2 or around the boundary. In addition, the back periphery cleaning nozzle 8 is elevatable by an elevation mechanism 81. With this, the back periphery cleaning nozzle 8 can be lowered in order not to interfere with the upper cup 41, the air-knife 31, and the like when the wafer W is horizontally shifted by the suction pads 2. The back periphery cleaning nozzle 8 may be configured as, for example, a dual fluid nozzle. The cleaning fluid for cleaning the back surface of the wafer W may be a mixture of DIW and nitrogen. Namely, the dual fluid nozzle is configured to allow a liquid element (DIW) and a gas element (nitrogen) to be mixed at and near the tip portion of the dual fluid nozzle, thereby ejecting the mixture to the back surface of the wafer W.

Referring back to FIG. 7, the under-cup 43 has at its bottom portion a drain pipe 43a for discharging from the under-cup 43 the cleaning fluid received by the under-cup 43 and two exhaust pipes 43b for flowing out the air inside the cleaning apparatus 100. The exhaust pipes 43b protrude upward from the bottom of the under-cup 43 in order to prevent the cleaning fluid remaining in the bottom from flowing into the exhaust pipes 43b. A ring-shaped inner cup 42 is provided around the air-knife 31 so as to be placed over the exhaust pipes 43b in order to prevent the cleaning fluid from dribbling into the exhaust pipes 43b.

A blowing nozzle 44 is provided above the upper-cup 41. The blowing nozzle 44 ejects gas, for example, pressurized air toward the top peripheral area or around the wafer W from above. The blowing nozzle 44 is movable upward/downward by an elevating mechanism 45, which makes it possible for the blowing nozzle 44 to move upward in order not to touch the wafer W and the transfer arm A5 (FIG. 3) when the wafer W is being transferred in and out of the cleaning apparatus 100.

A lamp box 47 that houses a UV lamp 46 is attached on a side wall of the under-cup 43, the side wall having no belts, as shown in FIG. 5. The wafer W is transferred in and out of the cleaning apparatus 100, passing over the UV lamp 46. Therefore, the UV lamp 46 can emit ultraviolet light toward the back surface of the wafer W, while the wafer W is being transferred out of the cleaning apparatus 100, in order to shrink particles remaining, if any, on the back surface of the wafer W.

Next, a cleaning fluid supplier and a nitrogen gas supplier are described in reference to FIG. 7. The cleaning fluid nozzle 61 and the gas nozzle 62 of the top surface cleaning nozzle 6 are connected to a cleaning fluid (DIW) source 65 and a nitrogen gas source 66, respectively, via corresponding supply lines 61a, 62a having corresponding flow rate control units 61b, 62b. In addition, the bevel cleaning nozzles 71, 72 are connected to the cleaning fluid (DIW) source 65 via a supply line 7a having a flow rate control unit 7b. The back periphery cleaning nozzle 8 is connected to the cleaning fluid (DIW) source 65 and the nitrogen gas source 66 via corresponding supply lines 81a, 82a having corresponding flow rate control units 81b, 82b. In addition, the blowing nozzle 44 is connected to the nitrogen gas source 66 via a supply line 44a having a flow rate control unit 44b. The flow rate control units 61b, 62b, 7b, 81b, 82b, and 44b include corresponding valves and flow controllers (not shown), and control starting/stopping supply of the cleaning fluid and the nitrogen gas and their flow rates under control of a controller 200 (described below).

Referring again to FIGS. 6 and 7, the cleaning apparatus 100 is provided with a controller 200. The controller 200 controls operations of the cleaning apparatus 100. The controller 200 may be a computer to which a program storing unit 200a is connected. The program storing unit 200a stores a computer program including steps (instructions) of causing each component or part of the cleaning apparatus 100 to perform predetermined cleaning operations described below.

The controller 200 retrieves the computer program from the program storing unit 200a and controls the components or parts in accordance with the program. Specifically, the controller 200 outputs instructions to various components or parts in order to control the transfer mechanism A1, the main transfer mechanisms A2, A3, the transfer arms A4, A5, the suction pads 2, and the spin chuck 3 to allow the wafer W to be transferred between the transfer mechanisms A1 through A3, the transfer arms A4, A5, the suction pads 2 and the spin chuck 3, and the brush 5, the top surface cleaning nozzle 6, the bevel cleaning nozzle 7, and the back periphery cleaning nozzle 8 and the like to clean the wafer W.

The computer program is stored in a computer readable storage medium 200c, such as a hard disk, a CD-ROM/RAM, a magneto-optical disk, various memory cards, a USB memory, or the like, and loaded to the program storing unit 200a through an input/output (I/O) unit 200b.

Next, cleaning operations performed by the cleaning apparatus 100 having the above configuration are described, in reference to FIGS. 11 through 14B. In these drawings, the UV lamp 46 and the like are omitted in these drawings for simplicity of illustration.

Figure 11:
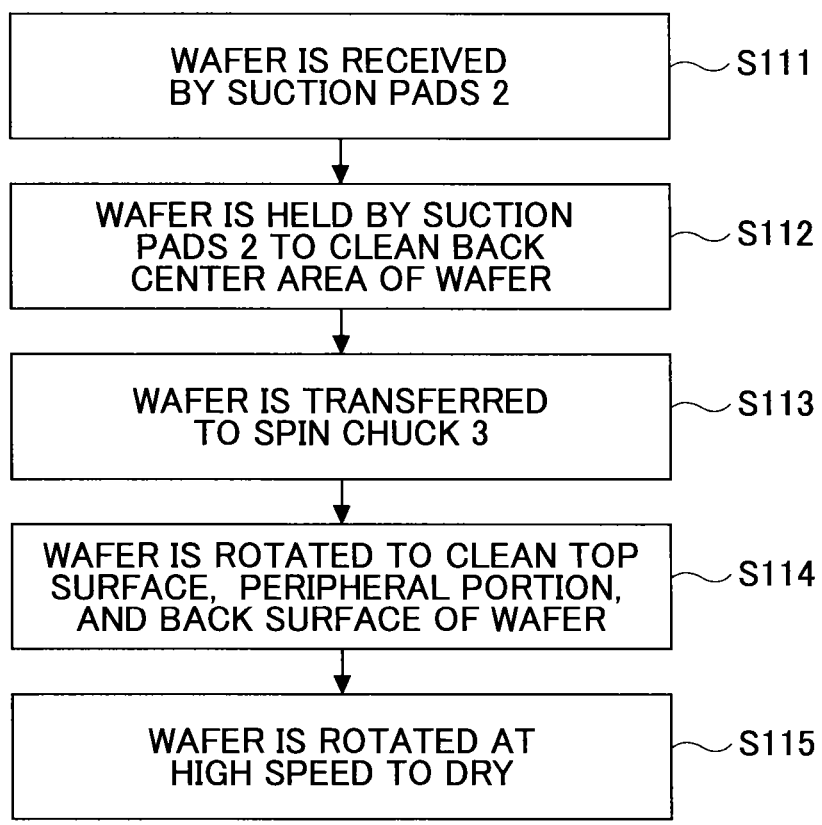
FIG. 11 is a flowchart showing a cleaning process carried out in a cleaning apparatus according to an embodiment of the present invention.
Figure 12A:
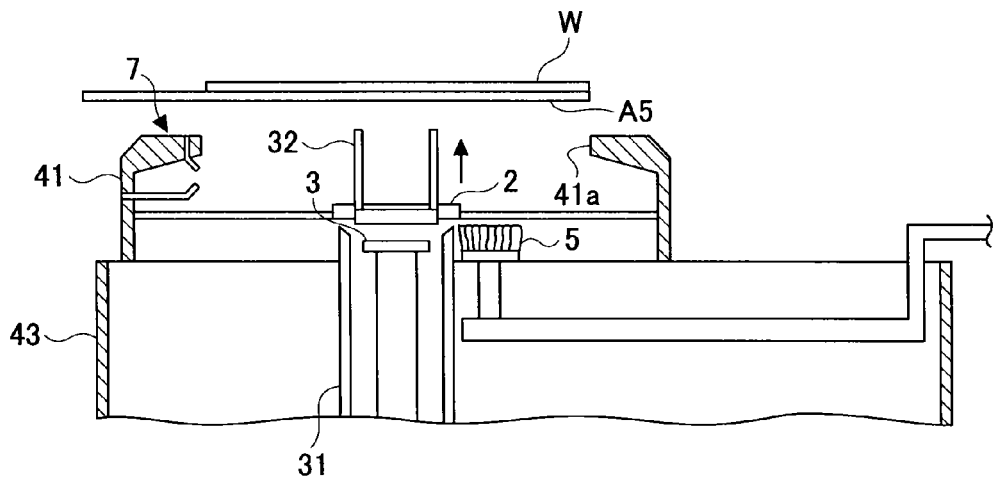
FIGS. 12A through 12C are step-by-step explanatory cross-sectional views of the cleaning apparatus according to the embodiment of the present invention.
Figure 12B:
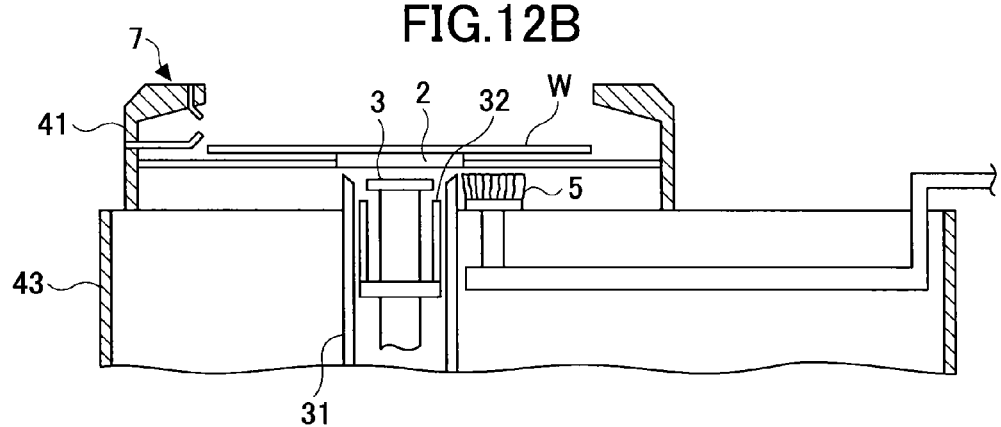

As shown in FIG. 12A, the transfer arm A5 having a top view shape of "U" (or "C") at the end (see FIG. 3) transfers the wafer W to be cleaned to the cleaning apparatus 100 and stops at a standby position in order to keep the wafer W above the upper opening 41a of the upper cup 41. Next, the supporting pins 32 move upward from below the spin chuck 3 to a position below the transfer arm A5. Then, the transfer arm A5 moves downward from the standby position in order to allow the wafer W to rest on the supporting pins 32, and subsequently retreats from the cleaning apparatus 100. At this time, the upper ends of the suction pads 2 are positioned below the wafer W supported by the supporting pins 32 and above the upper end of the brush 5. In addition, the upper surface of the spin chuck 3 is positioned below the upper end of the brush 5. Subsequently, when the supporting pins 32 move downward, the wafer W is transferred onto the suction pads 2 (FIG. 12B, step S111 in FIG. 11).

Figure 12C:
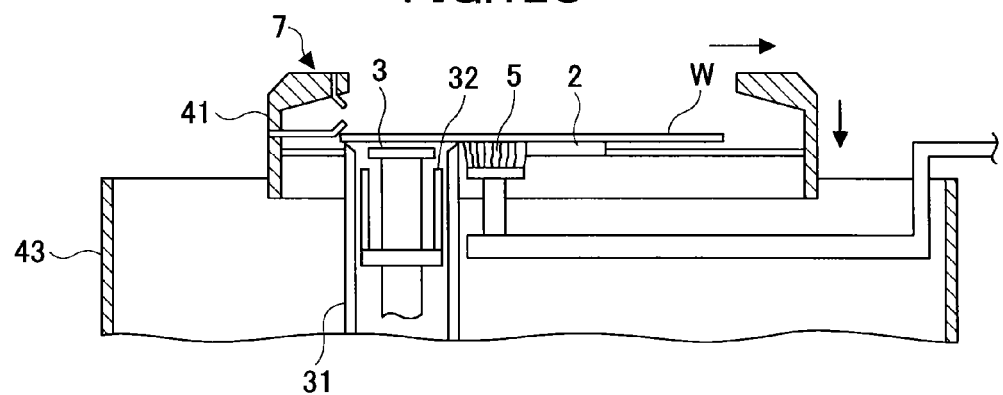

Then, the suction pads 2 hold the wafer W by suction so that the wafer cannot be raised even when the brush 5 is pressed on the back surface of the wafer W. While holding the wafer W, the suction pads 2 are moved rightward to above the upper surfaces of the spin chuck 3, the brush 5, and the air-knife 31. After reaching a predetermined position, for example, where the left edge of the air-knife 31 substantially corresponds to the left edge of the wafer W, the suction pads 2 move downward and allow the back surface of the wafer W to touch the brush 5 (FIG. 12C). In this situation, the altitude of the wafer W in the upper cup 41 corresponds to the first cleaning position. Specifically, the spin chuck 3 is positioned below the suction pads 2 and the top surface of the air-knife 31 is positioned slightly below the back surface of the wafer W.

Figure 14A:
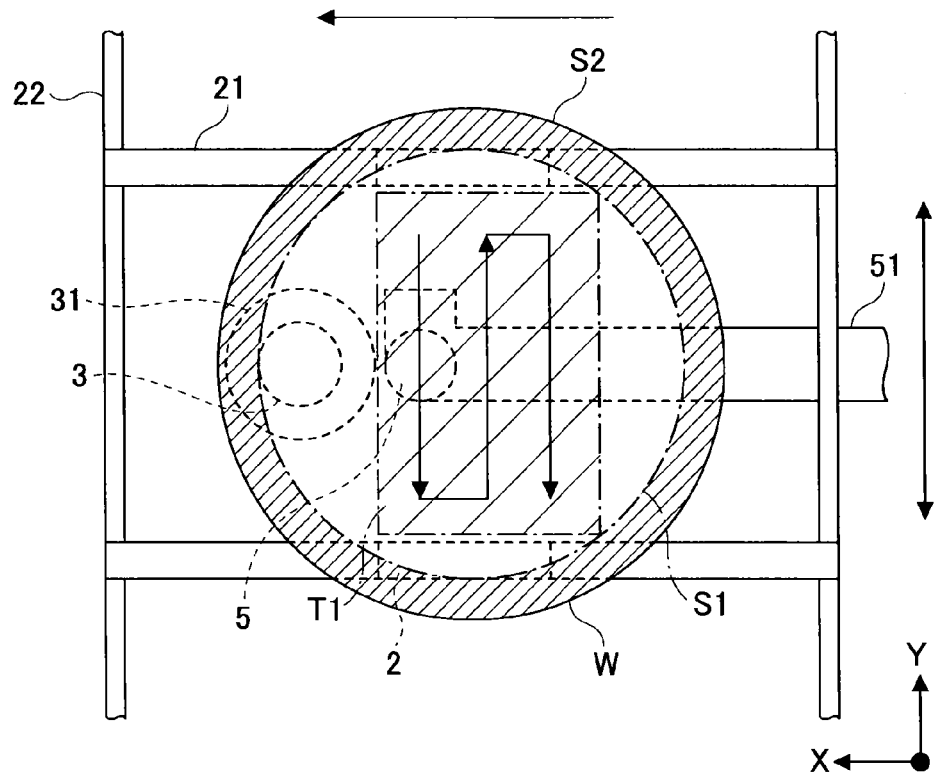
FIGS. 14A and 14B illustrate a positional relationship between a wafer, a spin chuck, suction pads, and a brush in the cleaning apparatus according to the embodiment of the present invention.
Figure 14B:
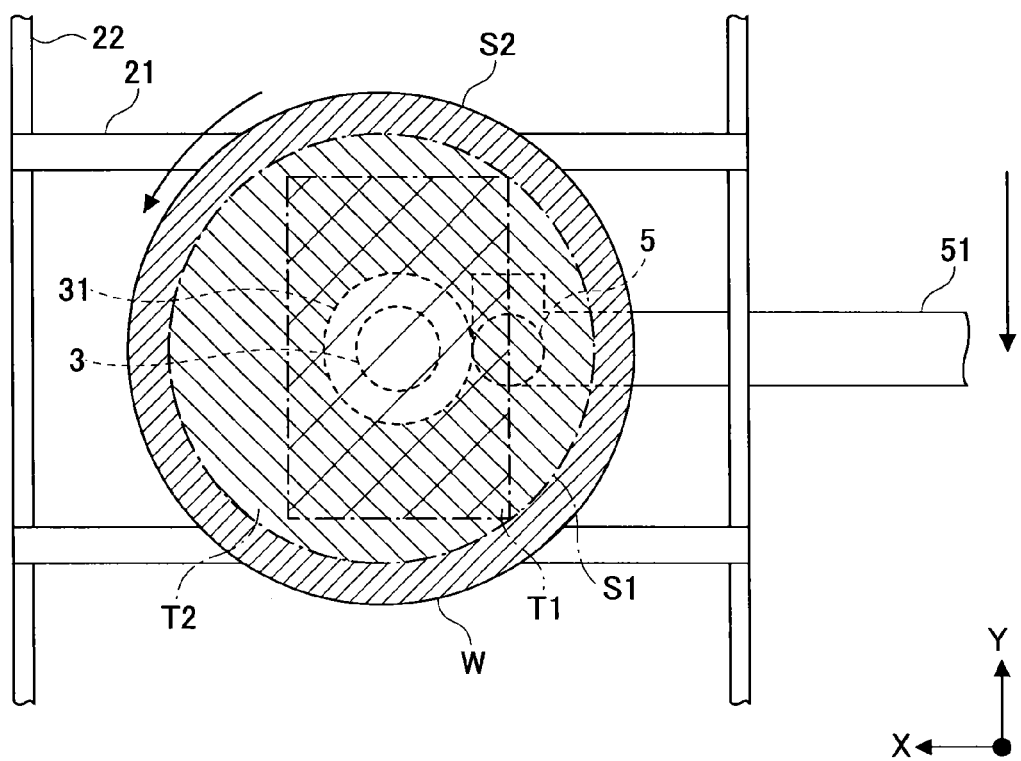

Next, after the gas is blown out from the ejection orifices 31a (FIG. 8) of the air-knife 31, the cleaning fluid is ejected out from the cleaning fluid nozzle 5a (FIG. 6) at the distal end of the support portion 51 toward the back surface of the wafer W and the brush 5 is rotated, so that cleaning the center area in the back surface of the wafer W is started (Step S112). At this time, the gas blown out from the ejection orifices 31a of the air-knife 31 can prevent the cleaning fluid from splashing on the top surface of the spin chuck 3. While the back surface of the wafer W is being cleaned, the suction pads 2 and the brush 5 cooperatively move in order to clean a wider area of the back surface of the wafer W. Specifically, while the brush 5 is reciprocating in the Y direction as shown in FIG. 14A, the suction pads 2 shift toward left in the X direction by a distance smaller than the diameter of the brush 5 when the brush 5 reverses the directions. Due to such movements, the brush 5 can trace a zigzag track on the back surface of the wafer W as shown by an arrow in FIG. 14A. As a result, a hatched line area T1 in FIG. 14A is uniformly cleaned. The area T1 includes the second area in the back surface of the wafer W, i.e., that area which is to be later held by the spin chuck 3, and which, as shown in FIG. 14B, lies in the first cleaning area S1.

Figure 13A:
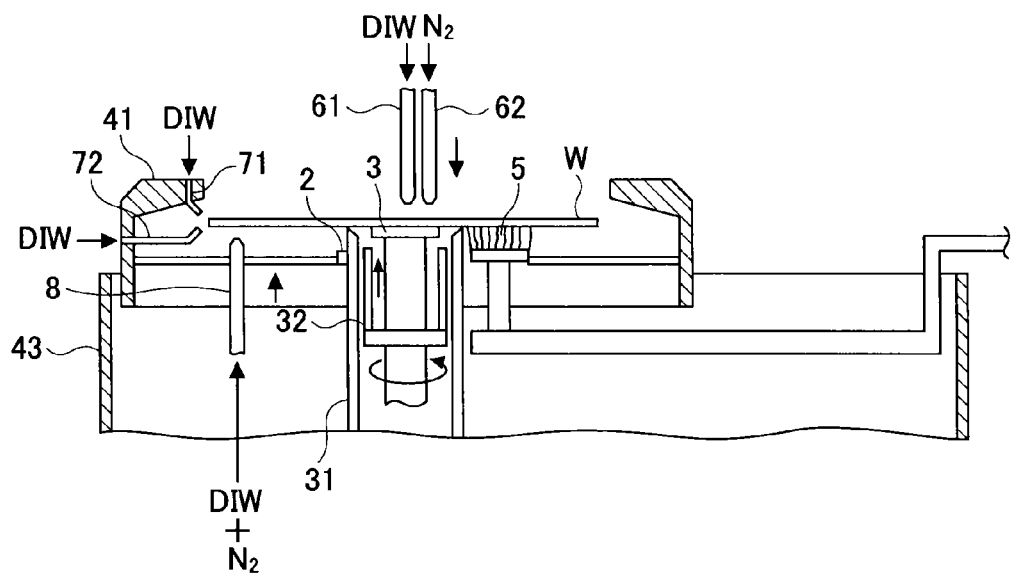
FIGS. 13A and 13B are step-by-step explanatory cross-sectional views of the cleaning apparatus according to the embodiment of the present invention.

After the area T1 is cleaned, the suction pads 2 are moved back to the left in order to bring the center of the wafer W in line with the center of the spin chuck 3, and then the wafer W is transferred from the suction pads 2 to the spin chuck 3, for example, in the following manner (FIG. 13A, step S113 in FIG. 11).

First, the brush 5 stops shifting and rotating while the gas is still ejected from the air-knife 31, and the cleaning fluid from the cleaning fluid nozzle 5a at the distal end of the supporting portion 51 (FIG. 6) is stopped. Next, the wafer W is released from being fixed on the suction pads 2, and the spin chuck 3 is raised to support the wafer W from the back side of the wafer W. Then, the suction pads 2 are moved downward and thus the wafer W is now placed on the spin chuck 3 and the spin chuck 3 then holds the wafer W by suction. The elevation of the wafer W placed on the spin chuck 3 corresponds to the elevation of the second cleaning position, which is above the first cleaning position in this example.

Figure 15A:
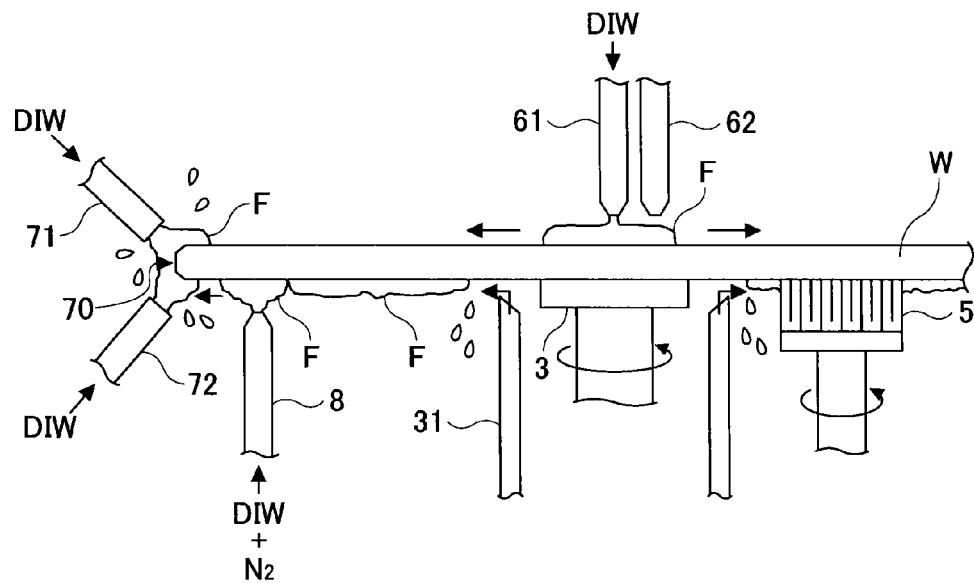
FIGS. 15A and 15B are explanatory views of a wafer being cleaned in the cleaning apparatus according to the embodiment of the present invention.
Figure 15B:
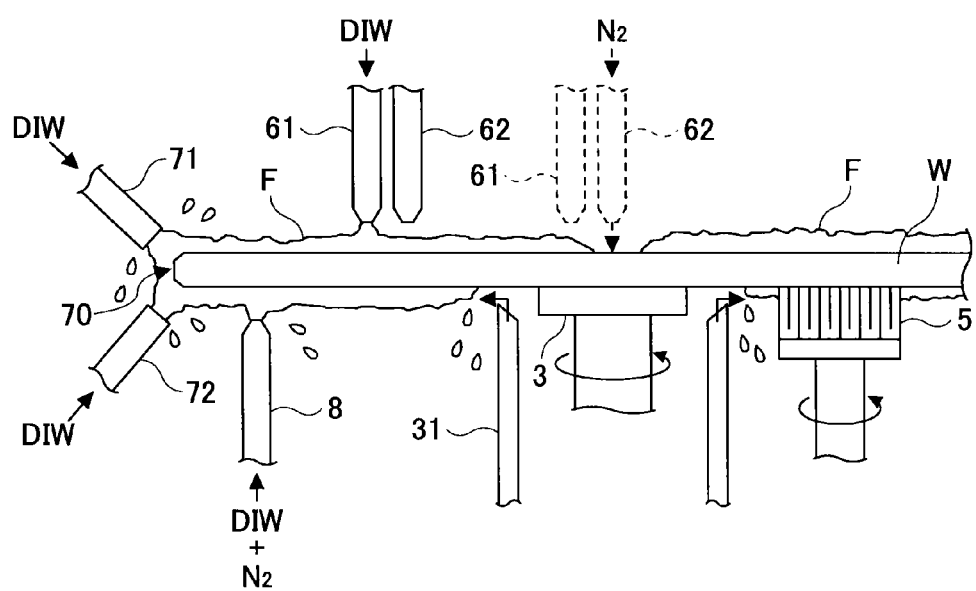

Next, the top surface, the bevel portion 70, and the back surface of the wafer W are cleaned preferably concurrently, as shown in FIGS. 13A, 15A, and 15B, while the wafer is held at the second cleaning position by the spin chuck 3. In this example, the top surface cleaning fluid nozzle 6 (61, 62) is brought downward so that the distal end of the cleaning nozzle 61 is positioned about 10 mm above the top center portion of the wafer W; the back periphery cleaning nozzle 8 is brought upward so that the distal end of the back periphery cleaning nozzle 8 is positioned about 5 mm below the boundary between the first cleaning area S1 and the second cleaning area S2 or around the boundary; and the brush 5 is pressed onto the back surface of the wafer W. In this case, while the elevation of the wafer W is above the first cleaning position when compared within the upper cup 41, the brush 5 can be pressed onto the back surface of the wafer W because the upper cup 41 (suction pad 2) is brought down.

Next, while the wafer W is being rotated by the spin chuck 3, the cleaning fluid is supplied to the top surface, the bevel portion 70, and the back periphery area from the top surface cleaning nozzle 6, the bevel cleaning nozzle 7, and the back periphery cleaning nozzle 8, respectively. At this time, the cleaning fluid is supplied to the back surface of the wafer W form the cleaning fluid nozzle 5a and the brush 5 is also rotated. In this manner, the top surface, the bevel portion 70, and the back periphery portion of the wafer W are cleaned (step S114).

The top surface of the wafer W is cleaned, for example, in the following manner. First, the cleaning fluid F is supplied to the center portion of the wafer W, as shown in FIG. 15A. Then, the cleaning fluid nozzle 61 is shifted outward in the radius direction of the wafer W while supplying the cleaning fluid F. The gas nozzle 62 is also shifted outward, along with the cleaning fluid nozzle 61, and to a position above the center portion of the wafer W (FIG. 15B). Here, the gas nozzle 62 blows nitrogen gas ($N_2$) toward the center portion of the wafer W for about 2 seconds. With this, after the cleaning fluid F is supplied to the center portion of the wafer W from the cleaning fluid nozzle 61, the center portion of the wafer W is dried by the $N_2$ gas from the gas nozzle 62. In addition, when the cleaning fluid nozzle 61 is slowly and continuously shifted toward the edge of the wafer W from the center portion of the wafer W while supplying the cleaning fluid F, the gas nozzle 62 is also slowly and continuously shifted along with the cleaning fluid nozzle 61 while ejecting the $N_2$ gas. Thus, in this example, every part of the top surface of the wafer W is cleaned by the cleaning fluid F supplied from the cleaning fluid nozzle 61 and then dried by the $N_2$ gas ejected from the gas nozzle 62. In addition, rotation of the wafer W causes the cleaning fluid F to flow outward by centrifugal force, thereby keeping dry dried part of the top surface of the wafer W.

While the gas nozzle 62 is shifted along with the cleaning fluid nozzle 61 in the above explanation, the gas nozzle 62 need not necessarily be shifted. This is because the top surface of the wafer W may be dried as long as the gas nozzle 62 can supply the $N_2$ gas toward the center portion. Namely, only the cleaning fluid nozzle 61 may be slidable in this case.

As shown in FIGS. 15A and 15B, the bevel portion 70 of the wafer W is cleaned with the cleaning fluid F ejected from the upper nozzle 71 and the lower nozzle 72 while the wafer W is being rotated. Specifically, the cleaning fluid F is ejected with strong force to the bevel portion 70 from the nozzles 71, 72, so that particles on the bevel portion 70 can be removed by the colliding force of the cleaning fluid F. In this case, because the wafer W is being rotated, the cleaning fluid F can reach the entire bevel portion 70 of the wafer W, and be spun off from the bevel portion 70 by the centrifugal force caused by the rotation of the wafer W, which can flow the particles away from the bevel portion 70.

The first cleaning area S1 (FIG. 10) of the back surface of the wafer W is cleaned by cooperative movement of the spin chuck 3, which rotates the wafer W, and the brush 5, which shifts along the radius direction of the wafer W. For example, the brush 5 is first positioned so that the brush 5 can clean an outermost portion of the first cleaning area S1 of the wafer W, and the spin chuck 3 slowly rotates the wafer W. Then, when the wafer W is rotated, for example, by 360 degrees, the brush 5 is shifted toward the center portion of the wafer W by a length corresponding to a diameter or less of the brush 5. When such operations are repeated, the brush 5 cleans the back surface of the wafer W, moving along a concentric path on the back surface. Therefore, an area T2 marked with diagonal lines rising from right to left (hatching) in FIG. 14B can be uniformly cleaned.

On the other hand, the second cleaning area S2 is cleaned with the DIW (also shown by cleaning fluid "F" in FIGS. 15A and 15B) ejected from the back periphery cleaning nozzle 8. For example, the back periphery cleaning nozzle 8 is positioned at or around the boundary between the first cleaning area S1 and the second cleaning area S2, and ejects the DIW containing nitrogen bubbles. The DIW having reached the back surface of the wafer W flows on the back surface of the wafer W toward the edge of the wafer W by centrifugal force. Therefore, the second cleaning area S2 is wet with the DIW. In addition, when the DIW is spun off from the edge of the wafer W by the centrifugal force, the particles are also washed away from the wafer W by the DIW. Moreover, when the back periphery cleaning nozzle 8 is configured into a dual fluid nozzle, the impact of the DIW onto the back surface of the wafer W is enhanced. Therefore, the particles can be struck up by the colliding force and easily washed away, leading to an efficient cleaning effect.

When cleaning is being carried out at step S114 as explained in the above exemplary manner, the back surface of the wafer W is covered or substantially covered by a cleaning fluid film F, and the particles removed by the brush 5 are washed away along with the cleaning fluid that falls down from the back surface of the wafer W toward the under cup 43.

In addition, because the gas is ejected toward the back surface of the wafer W from the ejection orifices 31a of the air-knife 31 during the cleaning, the cleaning fluid (DIW) is blown outward, so that part of the back surface opposing the air-knife 31 can be kept dry. Namely, the air-knife 31 prevents the cleaning fluid from reaching the spin chuck 3, thereby keeping the spin chuck 3 dry. While water marks may be formed on the back surface of the wafer W when, for example, the top surface of the spin chuck 3 is wet, such water marks are not formed in the above configuration because the top surface of the spin chuck 3 is kept dry.

As shown in FIG. 14B, a combined area of the area T1 and the area T2 of the back surface of the wafer W covers completely the first cleaning area S1 of the back surface of the wafer W without leaving uncleaned areas, which is realized by adjusting in advance, for example, the size and operations of each component or part of the cleaning apparatus 100. Especially, when part of the brush 5 may enter an area, which is not hydrophobized in the second cleaning area S2, the entire first cleaning area S1 is assuredly cleaned.

Because the DIW is used as the cleaning fluid F for cleaning the top surface, the bevel portion 70, and the back surface of the wafer W, these areas can be cleaned concurrently without any disadvantage that may be caused when different cleaning fluids are used. In addition, when the top surface, the bevel portion 70, and the back surface of the wafer W are concurrently cleaned, even if mist (or droplets) of the cleaning fluid, which may include particles, is caused above the top surface of the wafer W and scattered to, for example, the bevel portion 70, such mist (droplets) can be washed away from the bevel portion 70, because the bevel portion 70 is being cleaned at the same time. In other words, particles can be removed from the wafer W by concurrently cleaning the top surface, the bevel portion 70, and the back surface of the wafer W, and thus the cleaning effect is improved.

Figure 13B:
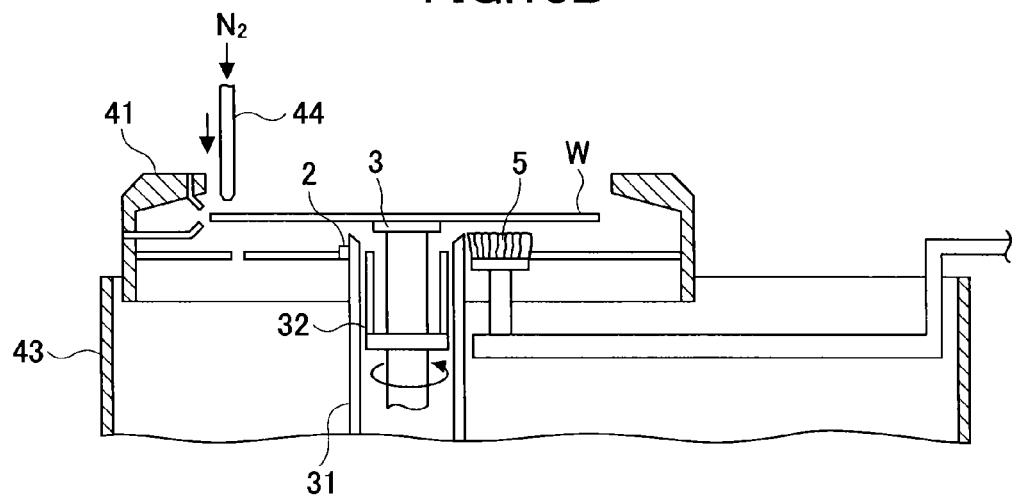

After the top surface, the bevel portion 70, and the back surface of the wafer W are cleaned in the above manner, the top cleaning nozzle 6 is moved upward, and the back periphery cleaning nozzle 8 is moved downward. In addition, the brush 5 stops rotating and shifting; the cleaning fluid nozzle 5a stops supplying the cleaning fluid; and the spin chuck 3 stops rotating. Then, the spin chuck 3 starts spinning the wafer W in order to spin off the cleaning fluid remaining mainly on the back surface of the wafer W, and as a result, the wafer W is dried (step S115 in FIG. 11). Since the cleaning fluid remaining on the back surface is suddenly spun off, the wafer marks are not formed. At this time, the blowing nozzle 44, which has been retreated upward, is moved downward as shown in FIG. 13B, and the supporting portion 51 is moved so that the blowing nozzle 5b next to the brush 5 is positioned below the bevel portion 70 of the wafer W. With this, the gas can be blown to the bevel portion 70 from above and below, thereby drying the bevel portion 70 of the wafer W. Although the second area of the back surface of the wafer W, which is held at the top surface of the spin chuck 3, is not subject to any drying procedures, no water marks are formed in the second area, because the second area can be kept dry in the first place by the air-knife 31, for example.

After cleaning and drying the back surface of the wafer W are completed as explained above, the wafer W is transferred to the transfer arm A5 (FIG. 3) in an opposite way of transferring the wafer W to the cleaning apparatus 100. When the wafer W is being transferred out, the UV lamp 46 is turned on and ultraviolet light is irradiated from the UV lamp 46 (FIGS. 5 and 6) toward the back surface of the wafer W that is being supported by the transfer arm A5 (FIG. 3) whose wafer-supporting end is U-shaped. Even if particles remain on the back surface of the wafer W, since the UV light can decompose organic substances, the particles which may originate from the photoresist can be shrunk and removed from the back surface, thereby facilitating elimination of the defocusing problem.

While the wafer W is transferred from the cleaning apparatus 100, the suction pads 2 and the spin chuck 3 are moved back to standby positions, for example, the positions shown in FIG. 12A and wait for the next wafer to be transferred in. After the next wafer is transferred in, the procedures explained in reference to FIGS. 12A through 15B are repeated, and in such a manner plural wafers are processed in series.

<Second Embodiment>

Figure 16:
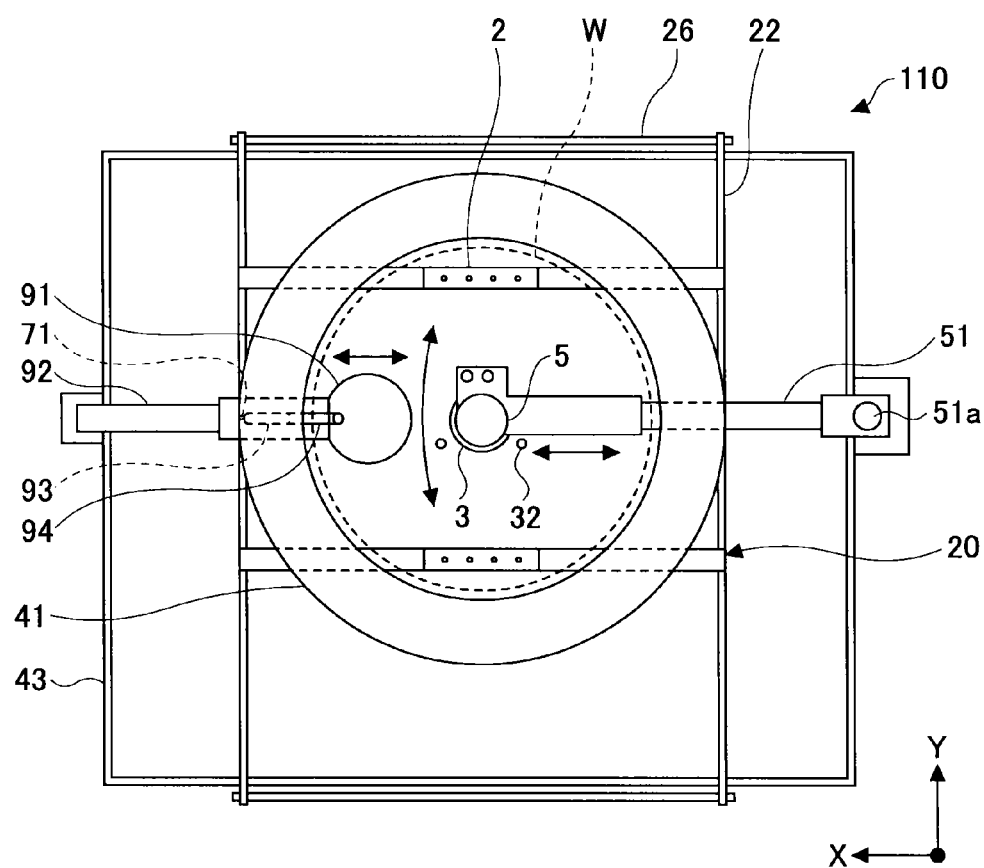
FIG. 16 is a plan view of a cleaning apparatus according to a second embodiment of the present invention.
Figure 17A:
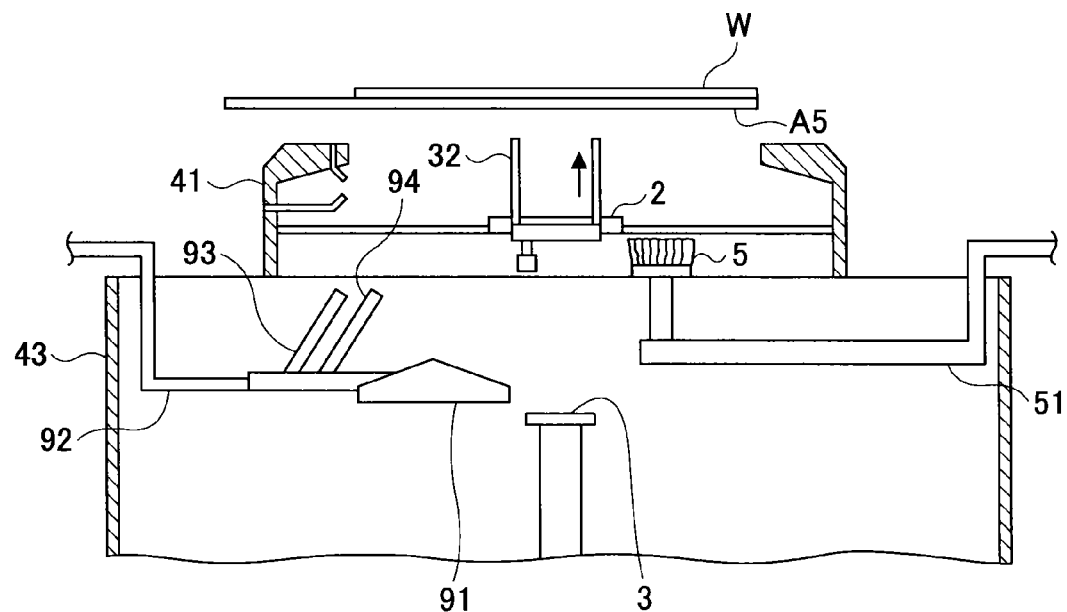
FIGS. 17A and 17B are explanatory cross-sectional views of the cleaning apparatus according to the second embodiment of the present invention.
Figure 17B:
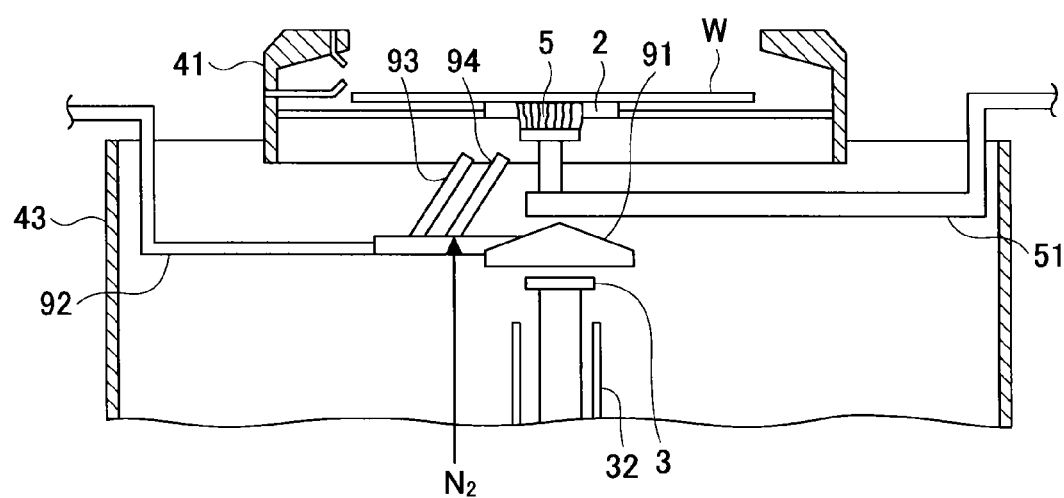
Figure 18:
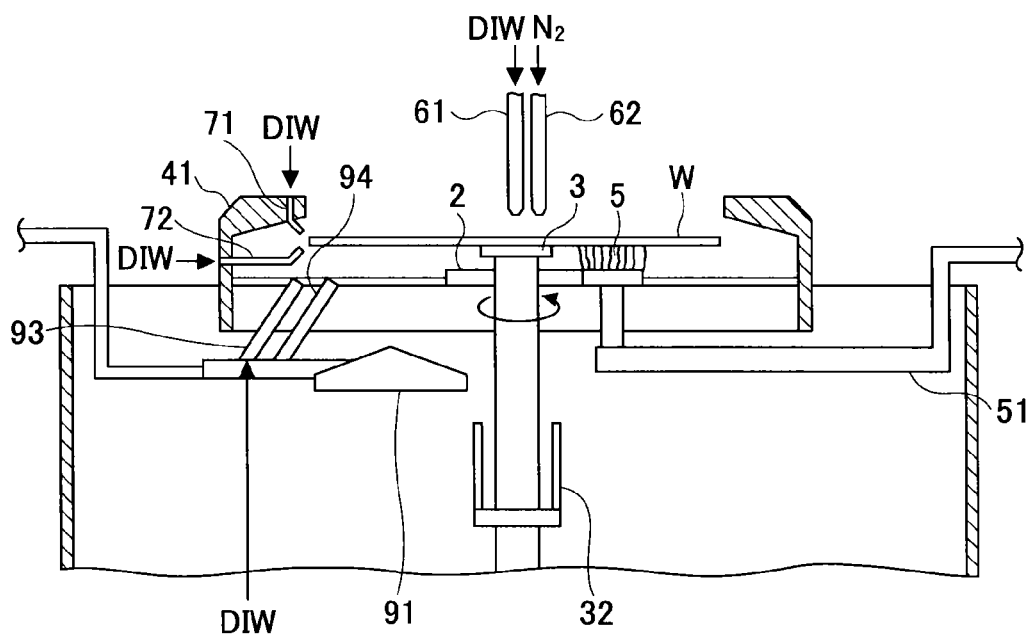
FIG. 18 is an explanatory cross-sectional view of the cleaning apparatus according to the second embodiment of the present invention.

Referring to FIGS. 16 through 18, a cleaning apparatus according to a second embodiment of the present invention is described. In these drawings, the same or corresponding reference marks used in FIGS. 1 through 8 are given to the same or corresponding members or components.

A cleaning apparatus 110 according to the second embodiment is different from the cleaning apparatus 100 according to the first embodiment in that the spin chuck 3 as the second substrate holding portion can be moved further downward below the second area in the back surface of the wafer W in order to allow the brush 5 to move above the spin chuck 3. In addition, the double cross portion 20 is fixed in the X direction and elevatable in the Z direction in the cleaning apparatus 110 according to the second embodiment, in contrast to the cleaning apparatus 100. The elevating mechanism 27 (FIG. 5) that moves the double cross portion 20 upward/downward, and the spin chuck motor 33 (FIG. 7) that moves the spin chuck 3 upward/downward serve as an elevating portion that can vertically move the spin chuck 3, which serves as the second wafer holding portion, in relation to the suction pads 2, which serve as the first wafer holding portion. The brush 5 is attached at the distal end of the supporting portion 51, and the base end of the supporting portion 51 is fixed on the under cup 43. The supporting portion 51 is configured to be pivotable around a pivot 51a provided at the base end and retractable in order to elongate and contract, as shown in FIG. 16. With such a configuration, the brush 5 can clean the back surface of the wafer W from center (the second area) to edge without shifting the wafer W.

Referring to FIGS. 16 through 18, the cleaning apparatus 110 according to the second embodiment of the present invention includes a cover member 91 and a retractable supporting portion 92 for supporting the cover member 91. The cover member 91 is made of a water repellent material such as a fluorine resin or the like and has a diameter larger than or equal to the diameter of the top surface of the spin chuck 3. The base end of the supporting portion 92 is fixed on the top end of the side wall opposing the side wall where the base end of the supporting portion 51 is fixed. The cover member 91 attached at the distal end of the supporting portion 92 is in a standby position when the supporting portion 92 is retracted (FIG. 17A), and in a position over the spin chuck 3 when the supporting portion 92 is extended (FIG. 17B). With such a configuration, the cover member 91 can prevent the cleaning fluid from dribbling down on the top surface of the spin chuck 3 when the back surface of the wafer W is being cleaned. In addition, the cover member 91 may have plural ejection orifices at the circumferential portion in other embodiments, so that gas such as $N_2$ gas or the like can be blown out downward from the ejection orifices. With these orifices, the top surface of the spin chuck 3 is preferably prevented from being wet with mist or droplets caused from the cleaning fluid when the back surface of the wafer W is being cleaned. Since the cleaning apparatus 100 according to this embodiment does not include the air-knife 31, the ejection orifices of the cover member 91 are advantageous.

Moreover, the supporting portion 92 is provided with a back surface cleaning nozzle 93 configured to supply the cleaning fluid to the second cleaning area S2 in the back surface of the wafer W in order to clean the second cleaning area S2 and a drying nozzle 94 configured to blow gas toward the second area S2 of the back surface of the wafer W. The drying nozzle 94 serves as a drying portion that dries the second area of the back surface of the wafer W.

Next, operations of the cleaning apparatus 110 according to the second embodiment of the present invention are described. Referring to FIG. 17A, when the wafer W is transferred, the spin chuck 3 is positioned at the lower portion of the under cup 43 and the cover member 91 is positioned at the standby position (an upper lateral position with respect to the spin chuck 3). When the second transfer arm A5 brings the wafer W above the upper cup 41, the supporting pins 32 receive the wafer W from the second transfer arm A5 and place the received wafer W onto the suction pads 2. The suction pads 2, in turn, draw the wafer W using a suction tube (not shown in FIG. 17A) in order to hold the wafer W on the top of the suction pads 2.

Next, as shown in FIG. 17B, the supporting pins 32 are lowered so that the top ends of the supporting pins 32 are positioned below the top surface of the spin chuck 3; the supporting portion 92 is elongated in order to bring the cover member 91 over the spin chuck 3; and the supporting portion 51 is extended in order to bring the brush 5 below the center area of the back surface of the wafer W. Then, the suction pads 2 are lowered so that the brush 5 touches the back surface of the wafer W, and the center area, which includes the second area, is cleaned by rotating the brush 5 along with the cleaning fluid supplied toward the back surface from the cleaning fluid nozzle 5a (FIG. 6). As stated above, because the cover member 91 covers the spin chuck 3, acting like an umbrella, and the gas may be blown out downward from the cover member 91 in order to blow the mist or droplets away, the top surface of the spin chuck 3 is kept dry. After the center area of the back surface of the wafer W are cleaned, the supporting portion 51 is retracted to move the brush 5 toward the edge portion of the wafer W. Then, the drying nozzle 94 starts blowing the gas toward the second area, which is thus dried.

After the second area of the back surface of the wafer W is dried, the cover member 91 is moved back to the standby position, as shown in FIG. 18. Next, the spin chuck 3 is raised so that the top surface of the spin chuck 3 touches the cleaned and dried second area, and the wafer W is transferred from the suction pads 2 to the spin chuck 3, which then holds the wafer W by suction. Then, the wafer W is slowly rotated by the spin chuck 3. Next, the cleaning fluid is supplied to the back surface of the wafer W from the back periphery cleaning nozzle 8 (FIG. 15A), and the brush 5 is rotated and shifted by the supporting portion 51 that can be extended/contracted and is pivotable around the pivot 51a (FIG. 16) of the supporting portion 51. This is how the uncleaned area of the second cleaning area S2 and the first cleaning area S1 are cleaned. At this time, the cleaning fluid nozzle 61 and the bevel portion cleaning nozzle 71, 72 may eject cleaning fluid, so that the top surface and the bevel portion 70 are cleaned in such a manner described in the first embodiment.

When the back surface of the wafer W is cleaned by rotating the wafer W, the supporting pins 32 which stay in the lower portion of the under cup 43 are preferably prevented from being wetted with the cleaning fluid, for example, by housing the pins 32 in a capsule or the like (not shown).

After the above cleaning is completed, the wafer W is spun at a high speed by the spin chuck 3 so that the cleaning fluid on the wafer W is spun off and thus the wafer W becomes dry. Then, the wafer W is transferred from the spin chuck 3 to the supporting pins 32 in an opposite way of transferring the wafer W to the cleaning apparatus 110 and thus to the second transfer arm A5 (FIG. 3), and transferred out from the cleaning apparatus 110. It is apparent that the UV lamp 46 (FIGS. 5 and 6) may be used (turned on) also in this embodiment when the wafer W is being transferred out from the cleaning apparatus 110.

According to the cleaning apparatuses 100, 110 of the embodiments of the present invention, because the back surface of the wafer W is cleaned while the wafer W is supported from the back surface and kept face up, there is no need for a reverser that reverses the wafer for the purpose of cleaning the back surface of the wafer W, which eliminates the space required to implement the reverser and the space required to reverse the wafer W in the cleaning apparatuses 100, 110. As a result, the photoresist coater/developer or the photolithography system can be made compact when the cleaning apparatuses 100, 110 according to the embodiments of the present invention are integrated into the photoresist coater/developer or the system, compared with the conventional photoresist coater/developer or photolithography system.

In addition, because the wafer W is once held by the suction pads 2 and then by the spin chuck 3, or vice versa, when the back surface of the wafer W is cleaned in the cleaning apparatuses 100, 110, a region covered by the suction pads 2 can be cleaned when the wafer W is held by the spin chuck 3, and another region covered by the spin chuck 3 can be cleaned when the wafer W is held by the suction pads 2. In such a manner, the back surface of the wafer W can be entirely cleaned.

Moreover, because the wafer W is held face up when the back surface of the wafer W is cleaned in the cleaning apparatuses 100, 110, the cleaning fluid can be concurrently supplied to the top surface and the bevel portion 70 of the wafer W. In other words, the top surface, the bevel portion 70, and the back surface of the wafer W can be cleaned in one cleaning apparatus. If three cleaning apparatuses are used for cleaning the top surface, the bevel portion 70, and the back surface of the wafer W, respectively, the wafer W has to be transferred to those cleaning apparatuses one right after another, leading to reduction of production throughput.

Furthermore, because cleaning the top surface, the bevel portion 70, and the back surface (the first and the second cleaning areas S1, S2) of the wafer W can be overlapped time wise, a total cleaning time can be shortened.

In addition, the cleaning apparatuses 100, 110 may only occupy a space sufficient for one cleaning apparatus in a coater/developer when incorporated in the coater/developer, which can address the needs of avoiding an increased footprint as well as cleaning the wafer W within the coater/developer before the immersion exposure.

Moreover, when the first cleaning area S1 and the second cleaning area S2 (FIG. 10) in the back surface of the wafer W are cleaned, appropriate ways of cleaning can be chosen for each area, depending on their surface properties, thereby reducing particle generation during cleaning. Namely, while the first cleaning area S1 is cleaned by the brush 5 (FIG. 5) with the DIW supplied from the cleaning fluid nozzle 5a (FIG. 6), the second cleaning area S2 is cleaned by ejecting the DIW with the $N_2$ bubbles from the back periphery cleaning nozzle 8. Because the second cleaning area S2 may be hydrophobized by hydrophobizing agent flowing around the edge to the back surface of the wafer W, the second cleaning area S2 is likely to stay dry off of the cleaning fluid (DIW). In this case, if the second cleaning area S2 is cleaned by the brush 5, the brush 5 may be worn away on the dry surface of the second cleaning area S2, generating particles. However, the use of the back periphery cleaning nozzle 8 can avoid such particle generation. In addition, when the back periphery cleaning nozzle 8 is configured into the dual fluid nozzle, colliding force of the DIW and the $N_2$ bubbles can be increased, thereby assuredly removing the particles.

Although the present invention has been described in conjunction with the foregoing specific embodiments, many alterations and modifications will be apparent to those skilled in the art. For example, while the top surface, the bevel portion 70, and the back surface of the wafer W are concurrently cleaned in the above embodiments, this need not be the case. After one of the top surface, the bevel portion 70, and the back surface of the wafer W is cleaned, the others may be cleaned. Alternatively, after the top and the back surfaces are concurrently cleaned, the bevel portion 70 may be cleaned. In addition, after one of the first and the second cleaning areas S1, S2 are cleaned, the other may be cleaned. It should be noted here that "concurrently cleaned" includes that two or more the top surface, the bevel portion 70, and the back surface of the wafer W are cleaned during an overlapped time period. In addition, cleaning the top surface, the bevel portion 70, and the back surface of the wafer W can be started or ended with time lag, as long as the cleaning time period is overlapped.

While the second cleaning area S2 in the back surface of the wafer W is not cleaned by the brush 5 in the above embodiments, the second cleaning area S2 may be cleaned with the brush 5 in some instances. For example, when a sufficient amount of the cleaning fluid (DIW) can be supplied from the back periphery cleaning nozzle 8, the cleaning fluid may remain on the second cleaning area S2 even if the second cleaning area S2 is hydrophobized, which prevents the brush 5 from being worn out. In addition, when the hydrophobizing process is not carried out on the wafer W, the second cleaning area S2 and thus the entire back surface of the wafer W can be cleaned by the brush 5.

Moreover, the top surface cleaning nozzle 6, the bevel cleaning nozzle 7, and the back periphery cleaning nozzle 8 are not limited to those explained above in terms of their configuration, as long as the top surface cleaning nozzle 6, the bevel cleaning nozzle 7, and the back periphery cleaning nozzle 8 can supply the cleaning fluid (DIW) to the top surface, the bevel portion 70, and the back surface of the wafer W held by the spin chuck 3, respectively. For example, in addition to the dual fluid nozzle described above, a jet nozzle, a megasonic nozzle, and the like may be used to configure the nozzles 6, 7, 8.

Moreover, different cleaning fluids may be supplied from the top surface cleaning nozzle 6, the bevel cleaning nozzle 7, and the back periphery cleaning nozzle 8. Furthermore, these nozzles 6, 7, 8 may supply two or more cleaning fluids. In this case, the nozzles 6, 7, 8 can supply one cleaning fluid for one period of time and another cleaning fluid for another period of time. Additionally, after one of the top surface, the bevel portion 70, and the back surface of the wafer W is cleaned with one cleaning fluid, another may be cleaned with another cleaning fluid.

The top view shape of the suction pads 2 is not limited to the elongated rectangle shown in FIG. 6. For example, the suction pads 2 may have an arc-like top view shape in such a manner that the top view shape is curved along a circle concentric with the wafer edge of the wafer held by the suction pads 2. The suction pads 2 having such a top view shape allow a larger area of the back surface between the suction pads 2.

Therefore, such suction pads 2 are advantageous in that the larger area can be cleaned when the wafer W is held by the suction pads 2, and the brush 5 is less likely to be hindered by the suction pads 2.

While the cleaning apparatuses 100, 110 employ the brush 5, which may provide a high cleaning performance, as the cleaning member, the cleaning member is not limited to the brush 5 herein. For example, other types of cleaning members that can eject the cleaning fluid or the like toward the back surface of the wafer in order to remove particles on the back surface can be employed instead of the brush 5. Such cleaning members may be a dual-fluid nozzle, a jet nozzle, a megasonic nozzle, or the like. In addition, although the brush 5 is of a rotating type in the above embodiments, a brush of a vibrating type can be used. Furthermore, the cleaning fluid is not limited to the DIW or the purified water but other fluids can be used.

Additionally, while the cleaning apparatuses 100, 110 include 2 types of substrate supporting portions (the suction pads 2 and the spin chuck 3), the cleaning apparatuses 100, 110 may have three or more substrate supporting portions. For example, when the cleaning apparatuses 100, 110 have three substrate supporting portions L, M, and N (not shown), the wafer can be transferred twice, that is, from the substrate supporting portion L to the substrate supporting portion M, and from the substrate supporting portion M to the substrate supporting portion N. In this case, the substrate supporting portions M, N, for example, are considered as the first and the second substrate supporting portions, respectively.

Moreover, the photoresist coater/developer to which the cleaning apparatuses 100, 110 according to the embodiments of the present invention are incorporated is not limited to the one described above. Furthermore, the cleaning apparatuses 100, 110 according to the embodiments of the present invention may be provided in the process station B2 rather than the interface station B3.

The present application is based on Japanese Patent Application No. 2008-30857 filed with the Japanese Patent Office on Feb. 12, 2008, the entire contents of which are hereby incorporated herein by reference.

What is claimed is:

1. A cleaning method that cleans a substrate on which a photoresist film is formed, the photoresist film being to be exposed to exposure light in a manner of immersion exposure with a liquid layer being formed on a top surface of the photoresist film, the cleaning method comprising:
    a second-area cleaning step, wherein the substrate is held at a first area in a back surface of the substrate with a first substrate holding portion so that the top surface is kept face up, and a second area in the back surface of the substrate, the second area being not overlapped with the first area, is cleaned prior to immersion exposure;
    a substrate holding step, wherein the substrate is received by a second substrate holding portion, and the substrate is held at the second area in the back surface of the substrate by the second substrate holding portion;
    a top-surface cleaning step, wherein a top surface cleaning fluid is supplied to a top surface of the substrate that is held and rotated around a center of the substrate by the second substrate holding portion, thereby cleaning at least a part of the top surface, said part being cleaned including the center of the top surface;
    a bevel cleaning step, wherein a bevel cleaning fluid is supplied to a bevel portion of the substrate that is held and rotated around the center of the substrate by the second substrate holding portion, thereby cleaning the bevel portion;
    a back surface cleaning step, wherein one part of the back surface of the substrate, the one part not including the second area, is cleaned, the substrate being held and rotated around the center of the substrate by the second substrate holding portion, thereby cleaning the one part; and
    a step of, during the second-area cleaning step, creating a state of covering a substrate holding area of the second substrate holding portion with a cover member so as to prevent the cleaning fluid from being put on the substrate holding area.

2. The cleaning method of claim 1, wherein the top surface cleaning step, the bevel cleaning step, and the back surface cleaning step are overlapped time-wise.

3. The cleaning method of claim 1, further comprising a back periphery cleaning step, wherein a periphery cleaning fluid is supplied to a periphery area in the back surface of the substrate that is held and rotated around the center of the substrate by the second substrate holding portion, thereby cleaning the periphery area.

4. The cleaning method of claim 3, wherein the top surface cleaning step, the bevel cleaning step, the back surface cleaning step, and the back periphery cleaning step are overlapped time wise.

5. A coating and developing method comprising steps of:
    forming a photoresist film on a substrate;
    cleaning the substrate on which the photoresist film is formed in accordance with the cleaning method of claim 1; and
    exposing the photoresist film to exposure light through a liquid layer formed on the photoresist film.

6. A computer readable storage medium storing a computer program to be used in a cleaning apparatus that cleans a substrate on which a photoresist film is formed, the photoresist film being to be exposed to exposure light with a liquid layer being formed on a top surface of the photoresist film, the computer program, when executed by a computer, comprising steps that cause the cleaning apparatus to carry out a cleaning method of claim 1.

* * * * *